(12) United States Patent
Baeck et al.

(10) Patent No.: US 11,482,623 B2
(45) Date of Patent: Oct. 25, 2022

(54) THIN FILM TRANSISTOR ARRAY SUBSTRATE AND ELECTRONIC DEVICE INCLUDING THE SAME

(71) Applicant: LG Display Co., Ltd., Seoul (KR)

(72) Inventors: JuHeyuck Baeck, Paju-si (KR); Dohyung Lee, Seoul (KR); ChanYong Jeong, Seoul (KR)

(73) Assignee: LG Display Co., Ltd., Seoul (KR)

( * ) Notice: Subject to any disclaimer, the term of this patent is extended or adjusted under 35 U.S.C. 154(b) by 64 days.

(21) Appl. No.: 17/115,603

(22) Filed: Dec. 8, 2020

(65) Prior Publication Data

US 2021/0193839 A1 Jun. 24, 2021

(30) Foreign Application Priority Data

Dec. 23, 2019 (KR) .................. 10-2019-0173298

(51) Int. Cl.
*H01L 29/786* (2006.01)
*H01L 27/32* (2006.01)

(52) U.S. Cl.
CPC .... *H01L 29/78645* (2013.01); *H01L 27/3258* (2013.01); *H01L 29/78603* (2013.01); *H01L 29/78696* (2013.01)

(58) Field of Classification Search
CPC ............. H01L 27/1214; H01L 27/1222; H01L 27/1255; H01L 27/124; H01L 27/1251; H01L 27/32; H01L 27/3244; H01L 27/3258; H01L 27/3262; H01L 29/1033; H01L 29/42384; H01L 29/4908; H01L 29/7831; H01L 29/786; H01L 29/78603; H01L 29/78606; H01L 29/78645; H01L 29/78648; H01L 29/78696; H01L 51/52; H01L 27/1225; G02F 1/1362; G02F 1/1365

See application file for complete search history.

(56) References Cited

U.S. PATENT DOCUMENTS

2018/0158741 A1* 6/2018 Kim ..................... H01L 22/32

* cited by examiner

*Primary Examiner* — Cheung Lee
(74) *Attorney, Agent, or Firm* — Fenwick & West LLP

(57) ABSTRACT

Provided are a thin film transistor array substrate and an electronic device including the same. More specifically, the thin film transistor array includes a first active layer including a first area, a second area spaced apart from the first area, and a channel area provided between the first area and the second area, a first gate electrode disposed on the first active layer, and a second gate electrode disposed on the same layer as the first gate electrode to overlap one end of the first gate electrode and to which a signal corresponding to a signal applied to the first gate electrode is applied. Therefore, it is possible to have a structure for simultaneously controlling the threshold voltage, mobility, and subthreshold (S) parameter of a thin film transistor.

20 Claims, 27 Drawing Sheets

THIN FILM TRANSISTOR ARRAY SUBSTRATE AND ELECTRONIC DEVICE INCLUDING THE SAME

CROSS REFERENCE TO RELATED APPLICATIONS

This application claims priority from Republic of Korea Patent Application No. 10-2019-0173298, filed on Dec. 23, 2019, which is hereby incorporated by reference for all purposes as if fully set forth herein.

BACKGROUND

1. Field

Embodiments of the present disclosure relate to a thin film transistor (TFT) array substrate and an electronic device including the same.

2. Description of the Prior Art

With the development of information societies, demands for various electronic devices, such as display devices and lighting devices, are increasing in various forms. Such an electronic device may include a panel in which data lines and gate lines are disposed, a data driver for driving the data lines, and a gate driver for driving the gate lines.

In the panel which is the core of the electronic device, numerous transistors for various functions may be disposed to drive the panel.

For this reason, a panel manufacturing process is complicated and difficult to manage. Accordingly, pursuing the convenience of the process may cause degradation in the device performance of transistors.

In particular, it is difficult to design a transistor having a structure which satisfies requirements for a plurality of transistors which function differently.

SUMMARY

Embodiments of the present disclosure are directed to providing a thin film transistor (TFT) array substrate having a structure capable of simultaneously controlling the threshold voltage, mobility, and subthreshold (S) parameter of a TFT by including two different gate electrodes disposed on the same layer on one active layer and an electronic device including the TFT array substrate.

Embodiments of the present disclosure are also directed to providing a TFT array substrate which has a driving transistor structure with a positive threshold voltage value and a high S parameter and an electronic device including the TFT array substrate.

Embodiments of the present disclosure are also directed to providing a TFT array substrate which has a TFT structure with high mobility and an electronic device including the TFT array substrate.

In accordance with an aspect of the present disclosure, there is provided an electronic device including a panel including at least one first TFT and a driving circuit for driving the panel. The panel includes a substrate, a first active layer disposed on the substrate and including a first area, a second area spaced apart from the first area, and a channel area provided between the first area and the second area, a gate insulating film disposed on the first active layer, a first gate electrode disposed on the gate insulating film, a second gate electrode disposed on the same layer as the first gate electrode to overlap one end of the first gate electrode and to which a signal corresponding to a signal applied to the first gate electrode is applied, an interlayer insulating film disposed on the substrate on which the first and second gate electrodes are disposed, and first and second electrodes disposed apart from each other on the interlayer insulating film.

In accordance with another aspect of the present disclosure, there is provided a TFT array substrate including a first active layer disposed on a substrate and including a first area, a second area spaced apart from the first area, and a channel area provided between the first area and the second area, a gate insulating film disposed on the first active layer, a first gate electrode disposed on the gate insulating film, a second gate electrode disposed on the same layer as the first gate electrode to overlap one end of the first gate electrode and to which a signal corresponding to a signal applied to the first gate electrode is applied, an interlayer insulating film disposed on the substrate on which the first and second gate electrodes are disposed, and first and second electrodes disposed apart from each other on the interlayer insulating film.

According to embodiments of the present disclosure, it is possible to provide a TFT array substrate having a structure in which two different gate electrodes are disposed on the same layer on one active layer to simultaneously control the threshold voltage, mobility, and S parameter of a TFT and an electronic device including the TFT array substrate.

According to embodiments of the present disclosure, it is possible to provide a TFT array substrate which has a driving transistor structure with a positive threshold voltage value and a high S parameter and an electronic device including the TFT array substrate.

According to embodiments of the present disclosure, it is possible to provide a TFT array substrate which has a TFT structure with high mobility and an electronic device including the TFT array substrate.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
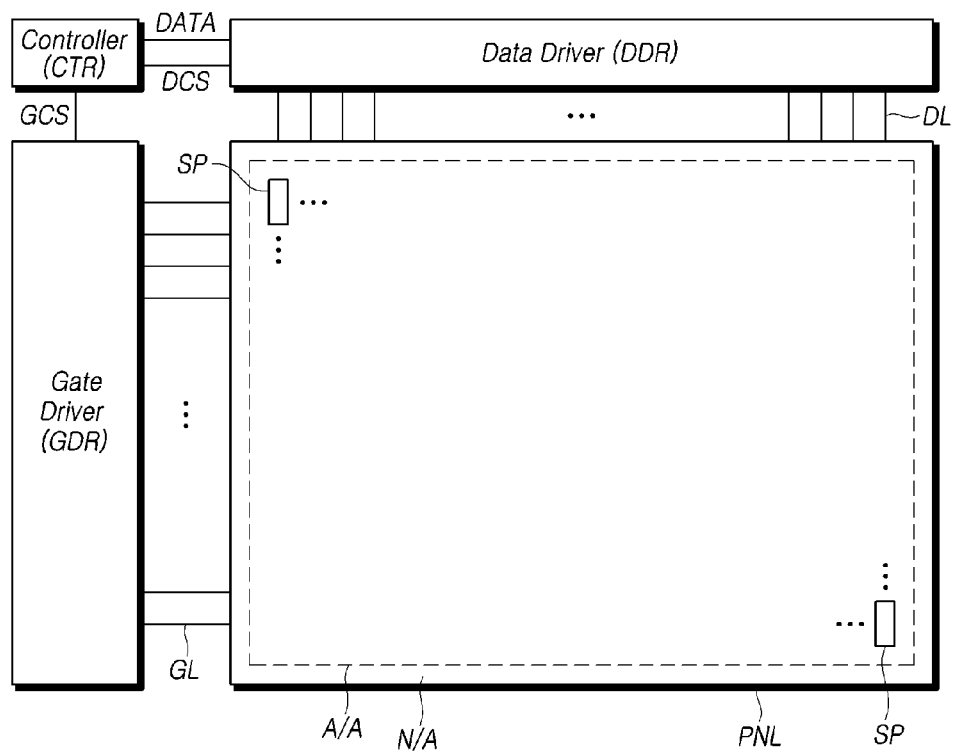
FIG. 1 is a diagram schematically illustrating a configuration of an electronic device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the descriptions may make the subject matter in some embodiments of the present disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element may be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc. are mentioned, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a diagram schematically illustrating a configuration of an electronic device according to embodiments of the present disclosure.

The electronic device according to the embodiments of the present disclosure may include a display device, a lighting device, a light-emitting device, and the like. For convenience of description, the display device will be mainly described below. However, in addition to the display device, the present disclosure may be applied to various other electronic devices, such as a lighting device and a light-emitting device, in the same way as long as a transistor is included.

The electronic device according to the embodiments of the present disclosure may include a panel PNL for displaying an image or outputting light and a driving circuit for driving the panel PNL.

In the panel PNL, a plurality of data lines DL and a plurality of gate lines GL may be disposed, and a plurality of subpixels SP defined by the plurality of data lines DL and the plurality of gate lines GL may be arranged in a matrix form.

In the panel PNL, the plurality of data lines DL and the plurality of gate lines GL may be arranged to cross each other. For example, the plurality of gate lines GL may be arranged in rows or columns, and the plurality of data lines DL may be arranged in columns or rows. For convenience of description, it is assumed below that the plurality of gate lines GL are disposed in rows and the plurality of data lines DL are disposed in columns.

In the panel PNL, in addition to the plurality of data lines DL and the plurality of gate lines GL, other kinds of signal lines may be disposed according to a subpixel structure and the like. Driving voltage lines, reference voltage lines, common voltage lines, or the like may be additionally disposed.

The panel PNL may be one of various types of panels such as a liquid crystal display (LCD) panel and an organic light-emitting diode (OLED) panel.

The types of signal lines disposed in the panel PNL may vary depending on a subpixel structure, a panel type (e.g., an LCD panel or an OLED panel), and the like. In this specification, signal lines may include electrodes to which signals are applied.

The panel PNL may include an active area A/A in which a video (images) is displayed and a non-active area (N/A)

which is an outer area of the active area A/A and does not display a video. The non-active area N/A may also be referred to as "bezel area."

In the active area A/A, the plurality of subpixels SP for displaying a video are disposed.

In the non-active area N/A, a pad section to which a data driver DDR is electrically connected may be disposed, and a plurality of data link lines for connecting the pad section and the plurality of data lines DL may also be disposed. The plurality of data link lines may be parts of the plurality of data lines DL extending to the non-active area N/A or additional patterns electrically connected to the plurality of data lines DL.

In the non-active area N/A, gate driving-related lines may be disposed to transfer a voltage (a signal) required for driving a gate to a gate driver GDR through the pad section to which the data driver DDR is electrically connected. For example, the gate driving-related lines may include clock lines for transferring a clock signal, gate voltage lines for transferring gate voltages VGH and VGL, gate-driving control signal lines for transferring various control signals required for generating scan signals, and the like. These gate driving-related lines are disposed in the non-active area N/A unlike the gate lines GL disposed in the active area A/A.

The driving circuit may include the data driver DDR for driving the plurality of data lines DL, the gate driver GDR for driving the plurality of gate lines GL, a controller CTR for controlling the data driver DDR and the gate driver GDR, and the like.

The data driver DDR may drive the plurality of data lines DL by outputting data voltages to the plurality of data lines DL.

The gate driver GDR may drive the plurality of gate lines GL by outputting scan signals to the plurality of gate lines GL.

The controller CTR may control a driving operation of the data driver DDR and the gate driver GDR by supplying various control signals DCS and GCS required for the driving operation of the data driver DDR and the gate driver GDR. Also, the controller CTR may supply image data DATA to the data driver DDR.

The controller CTR begins scanning according to a timing implemented in each frame, converts input image data, which is input from the outside of the electronic device, into a data signal format used in the data driver DDR to output converted image data DATA, and controls data driving at an appropriate time for scanning.

To control the data driver DDR and the gate driver GDR, the controller CTR receives timing signals, such as a vertical synchronization signal Vsync, a horizontal synchronization signal Hsync, an input data enable (DE) signal, and a clock signal CLK, from the outside (e.g., a host system) and generates various control signals, and outputs the various control signals to the data driver DDR and the gate driver GDR.

For example, to control the gate driver GDR, the controller CTR outputs various gate control signals GCS including a gate start pulse (GSP), a gate shift clock (GSC), a gate output enable (GOE) signal, and the like.

Also, to control the data driver DDR, the controller CTR outputs various data control signals DCS including a source start pulse (SSP), a source sampling clock (SSC), a source output enable (SOE) signal, and the like.

The controller CTR may be a timing controller used in general display technology or a control device which may perform other control functions in addition to those of the timing controller.

The controller CTR may be implemented as a component separate from the data driver DDR or integrated with the data driver DDR to be implemented as an integrated circuit.

The data driver DDR receives the image data DATA from the controller CTR and supplies data voltages to the plurality of data lines DL, thereby driving the plurality of data lines DL. The data driver DDR is also referred to as a "source driver."

The data driver DDR may transmit various signals to the controller CTR and receive various signals from the controller CTR through various interfaces.

The gate driver GDR sequentially drives the plurality of gate lines GL by sequentially supplying scan signals to the plurality of gate lines GL. The gate driver GDR is also referred to as a "scan driver."

The gate driver GDR sequentially supplies scan signals having an on-voltage or an off-voltage to the plurality of gate lines GL under the control of the controller CTR.

When a specific gate line is activated by the gate driver GDR, the data driver DDR converts the image data DATA received from the controller CTR into analog data voltages and supplies the analog data voltages to the plurality of data lines DL.

The data driver DDR may be disposed on only one side (e.g., the upper side or the lower side) of the panel PNL or disposed on both sides (e.g., the upper side and the lower side) of the panel PNL according to a driving method, a panel design method, etc. in some cases.

The gate driver GDR may be disposed on only one side (e.g., the left side or the right side) of the panel PNL or disposed on both sides (e.g., the left side and the right side) of the panel PNL according to a driving method, a panel design method, etc. in some cases.

The data driver DDR may include one or more source driver integrated circuits SDIC.

Each of the source driver integrated circuits SDIC may include a shift register, a latch circuit, a digital-to-analog converter (DAC), an output buffer, and the like. The data driver DDR may further include one or more analog-to-digital converters (ADCs) in some cases.

Each of the source driver integrated circuits SDIC may be connected to a bonding pad of the panel PNL in a tape automated bonding (TAB) type or chip-on-glass (COG) type or disposed directly on the panel PNL. In some cases, each of the source driver integrated circuits SDIC may be integrated and disposed in the panel PNL. Also, each of the source driver integrated circuits SDIC may be implemented in a chip-on-film (COF) type. In this case, each of the source driver integrated circuits SDIC may be mounted on a circuit film and electrically connected to the data lines DL in the panel PNL through the circuit film.

The gate driver GDR may include a plurality of gate driving circuits GDC. The plurality of gate driving circuits GDC may separately correspond to the plurality of gate lines GL.

Each of the gate driving circuits GDC may include a shift register, a level shifter, and the like.

Each of the gate driving circuits GDC may be connected to the bonding pad of the panel PNL in a TAB type or COG type. Also, each of the gate driving circuits GDC may be implemented in a COF type. In this case, each of the gate driving circuits GDC may be mounted on the circuit film and electrically connected to the gate lines GL in the panel PNL through the circuit film. Also, each of the gate driving circuits GDC may be implemented in a gate-in-panel (GIP)

type and embedded in the panel PNL. In other words, each of the gate driving circuits GDC may be formed directly in the panel PNL.

Figure 2:
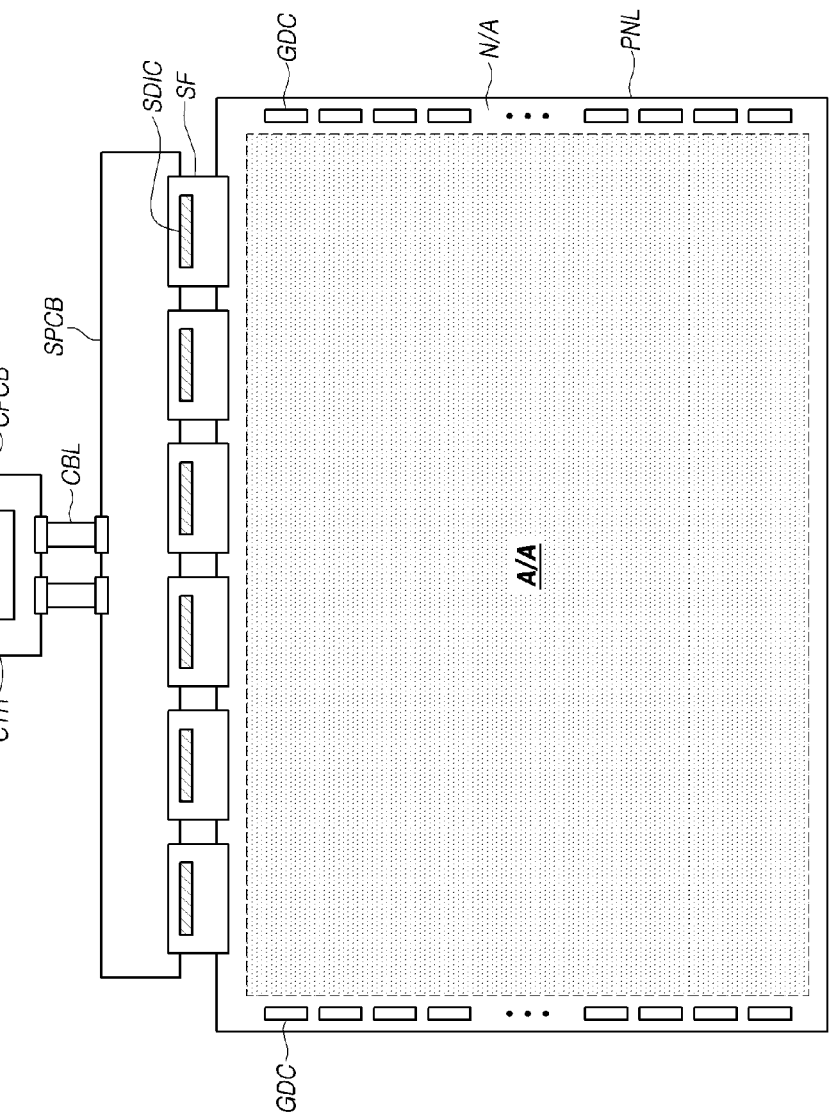
FIG. 2 is an exemplary diagram of system implementation of the electronic device according to the embodiments of the present disclosure.

FIG. 2 is an exemplary diagram of system implementation of the electronic device according to the embodiments of the present disclosure.

Referring to FIG. 2, in the electronic device according to the embodiments of the present disclosure, the data driver DDR may be implemented in a COF type among various types (TAB, COG, COF, etc.), and the gate driver GDR may be implemented in a GIP type among various types (TAB, COG, COF, GIP, etc.).

The data driver DDR may be implemented as one or more source driver integrated circuits SDIC. FIG. 2 illustrates a case in which the data driver DDR is implemented as a plurality of source driver integrated circuits SDIC.

When the data driver DDR is implemented in a COF type, each of the source driver integrated circuits SDIC for implementing the data driver DDR may be mounted on source-side circuit films SF.

One sides of the source-side circuit III films SF may be electrically connected to the pad section (a group of pads) present in the non-active area N/A of the panel PNL.

On the source-side circuit films SF, lines may be disposed to electrically connect the source driver integrated circuits SDIC to the panel PNL.

The electronic device may include one or more source printed circuit boards SPCB for circuit connection between the plurality of source driver integrated circuits SDIC and other devices and may include a control printed circuit board CPCB for mounting control parts and various electrical devices.

The other sides of the source-side circuit films SF on which the source driver integrated circuits SDIC are mounted may be connected to the one or more source printed circuit boards SPCB.

In other words, the one sides of the source-side circuit films SF on which the source driver integrated circuits SDIC are mounted may be electrically connected to the non-active area N/A of the panel PNL, and the other sides thereof may be electrically connected to the source printed circuit board SPCB.

On the control printed circuit board CPCB, the controller CTR for controlling operations of the data driver DDR, the gate driver GDR, etc. may be disposed.

Also, a power management integrated circuit (IC) PMIC and the like may be additionally disposed on the control printed circuit board CPCB to supply various voltages or currents to the panel PNL, the data driver DDR, the gate driver GDR, etc. or control the various voltages or currents to be supplied thereto.

The source printed circuit board SPCB and the control printed circuit board CPCB may be electrically connected to each other through at least one connecting member CBL. As an example, the connecting member CBL may be a flexible printed circuit (FPC), a flexible flat cable (FFC), or the like.

The one or more source printed circuit boards SPCB and the control printed circuit board CPCB may be integrated into one printed circuit board.

When the gate driver GDR is implemented in a GIP type, the plurality of gate driving circuits GDC included in the gate driver GDR may be formed directly on the non-active area N/A of the panel PNL.

Each of the plurality of gate driving circuits GDC may output a corresponding scan signal SCAN to a corresponding gate line GL disposed in the active area A/A of the panel PNL The plurality of gate driving circuits GDC disposed on the panel PNL may be supplied with various signals required for generating scan signals (a clock signal, a high-level gate voltage VGH, a low-level gate voltage VGL, a start signal VST, a reset signal RST, etc.) through the gate driving-related lines disposed in the non-active area N/A.

The gate driving-related lines disposed in the non-active area N/A may be electrically connected to source-side circuit films SL disposed closest to the plurality of gate driving circuits GDC.

Figure 3:
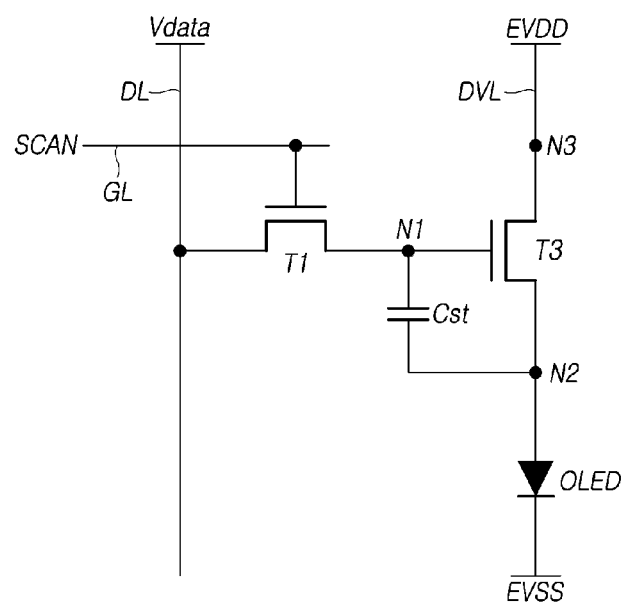
FIG. 3 is a diagram illustrating a structure of a subpixel when a panel according to the embodiments of the present disclosure is an organic light-emitting diode (OLED) panel.

FIG. 3 is a diagram illustrating a structure of a subpixel SP when the panel PNL according to the embodiments of the present disclosure is an OLED panel.

Referring to FIG. 3, in the panel PNL which is an OLED panel, each subpixel SP may additionally include a first transistor T1 for transferring a data voltage Vdata to a first node N1 corresponding to a gate node of a driving transistor T3 and a storage capacitor Cst for maintaining the data voltage Vdata corresponding to an image signal voltage or a voltage corresponding to the data voltage Vdata for one frame time.

An organic light-emitting diode OLED may include a first electrode (an anode or a cathode), an organic layer including at least one light-emitting layer, a second electrode (a cathode or an anode), and the like.

The driving transistor T3 drives the organic light-emitting diode OLED by supplying a driving current to the organic light-emitting diode OLED.

The driving transistor T3 may include the first node N1, a second node N2, and a third node N3.

The first node N1 of the driving transistor T3 may be a node corresponding to the gate node and electrically connected to a source node or a drain node of the first transistor T1.

The second node N2 of the driving transistor T3 may be electrically connected to a first electrode 301 of the organic light-emitting diode OLED and may be the source node or the drain node.

A driving voltage EVDD may be applied to the third node N3 of the driving transistor T3. The third node N3 may be electrically connected to a driving voltage line DVL which supplies the driving voltage EVDD and may be the drain node or the source node.

The driving transistor T3 and the first transistor T1 may be implemented as n-type transistors or p-type transistors.

The first transistor T1 may be electrically connected between the data line DL and the first node N1 of the driving transistor T3 and may be controlled by receiving the scan signal SCAN at the gate node through a gate line.

The first transistor T1 may be turned on by the scan signal SCAN and transfer the data voltage Vdata supplied from the data line DL to the first node N1 of the driving transistor T3.

The storage capacitor Cst may be electrically connected between the first node N1 and the second node N2 of the driving transistor T3.

The storage capacitor Cst may be an external capacitor, which is intentionally designed outside the driving transistor T3, rather than a parasitic capacitor (e.g., Cgs or Cgd), which is an internal capacitor present between the first node N1 and the second node N2 of the driving transistor T3.

Each subpixel structure illustrated in FIG. 3 is a two-transistor one-capacitor (2T1C) structure which is only an example for description. Each subpixel structure may further include one or more transistors or further include one or more capacitors in some cases. Alternatively, each of the plurality of subpixels may have the same structure, or some of the plurality of subpixels may have a different structure.

Figure 4:
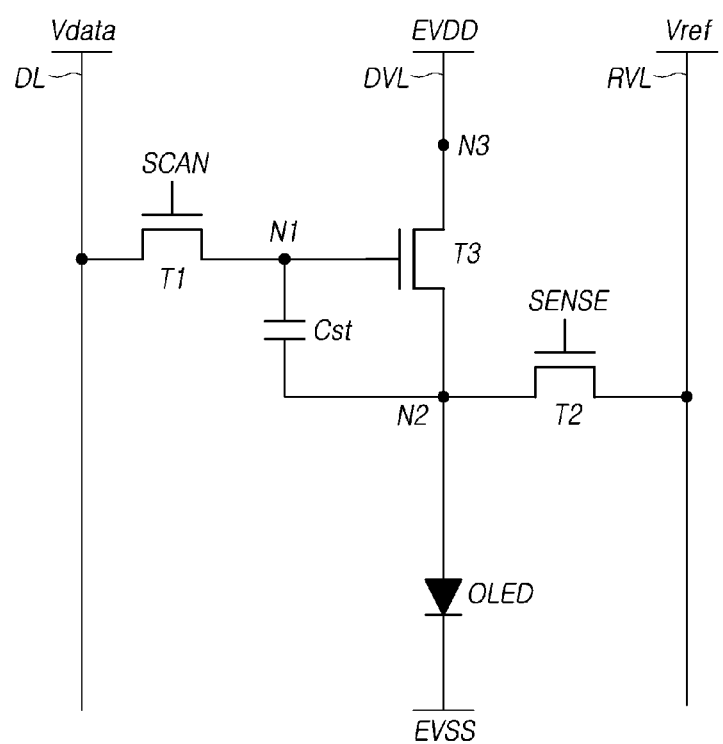
FIG. 4 is a diagram illustrating an example of a three-transistor one-capacitor (3T1C) structure in which one subpixel farther includes a second transistor electrically connected between a second node of a driving transistor and a reference voltage line according to the embodiments of the present disclosure.

FIG. 4 is a diagram illustrating a three-transistor one-capacitor (3T1C) structure in which one subpixel SP further includes a second transistor T2 electrically connected between the second node N2 of the driving transistor T3 and a reference voltage line RVL.

Referring to FIG. 4, the second transistor T2 may be electrically connected between the second node N2 of the driving transistor T3 and the reference voltage line RVL and receive a second scan signal SCAN2 at the gate node so that turning the second transistor T2 on or off may be controlled.

A drain node or a source node of the second transistor T2 may be electrically connected to the reference voltage line RVL, and the source node or the drain node of the second transistor T2 may be electrically connected to the second node N2 of the driving transistor T3.

For example, the second transistor T2 may be turned on during a display operation time period and turned on during a sensing operation time period for sensing a characteristic value of the driving transistor T3 or a characteristic value of an organic light-emitting diode OLED.

The second transistor T2 may be turned on by the second scan signal SCAN2 according to a corresponding driving timing (e.g., a display driving timing or an initialization timing during the sensing operation time period) and transfer a reference voltage Vref supplied to the reference voltage line RVL to the second node N2 of the driving transistor T3.

Also, the second transistor T2 may be turned on by the second scan signal SCAN2 according to a corresponding driving timing (e.g., a sampling timing during the sensing operation time period) and transfer the voltage of the second node N2 of the driving transistor T3 to the reference voltage line RVL.

In other words, the second transistor T2 may control the voltage state of the second node N2 of the driving transistor T3 or transfer the voltage of the second node N2 of the driving transistor T3 to the reference voltage line RVL.

The reference voltage line RVL may be electrically connected to an ADC which senses and converts the voltage of the reference voltage line RVL into a digital value and outputs sensing data including the digital value.

The ADC may be included in the source driver integrated circuit SDIC implementing the data driver DDR.

The sensing data output from the ADC may be used to sense a characteristic value (e.g., a threshold value, mobility, or the like) of the driving transistor T3 or a characteristic value (e.g., a threshold value, or the like) of the organic light-emitting diode OLED.

Meanwhile, the storage capacitor Cst may be an external capacitor, which is intentionally designed outside the driving transistor T3, rather than a parasitic capacitor (e.g., Cgs or Cgd), which is an internal capacitor present between the first node N1 and the second node N2 of the driving transistor T3.

Each of the driving transistor T3, the first transistor T1, and the second transistor T2 may be an n-type transistor or a p-type transistor.

Meanwhile, a first scan signal SCAN1 and the second scan signal SCAN2 may be separate gate signals. In this case, the first scan signal SCAN1 and the second scan signal SCAN2 may be applied to the gate node of the first transistor T1 and the gate node of the second transistor T2 through different gate lines, respectively.

In some cases, the first scan signal SCAN1 and the second scan signal SCAN2 may be identical gate signals. In this case, the first scan signal SCAN1 and the second scan signal SCAN2 may be applied in common to the gate node of the first transistor T1 and the gate node of the second transistor T2 through the same gate line.

The subpixel structures illustrated in FIGS. 3 and 4 are only examples for description. The subpixel structures may further include one or more transistors or further include one or more capacitors in some cases.

Alternatively, each of the plurality of subpixels may have the same structure, or some of the plurality of subpixels may have a different structure.

Figure 5:
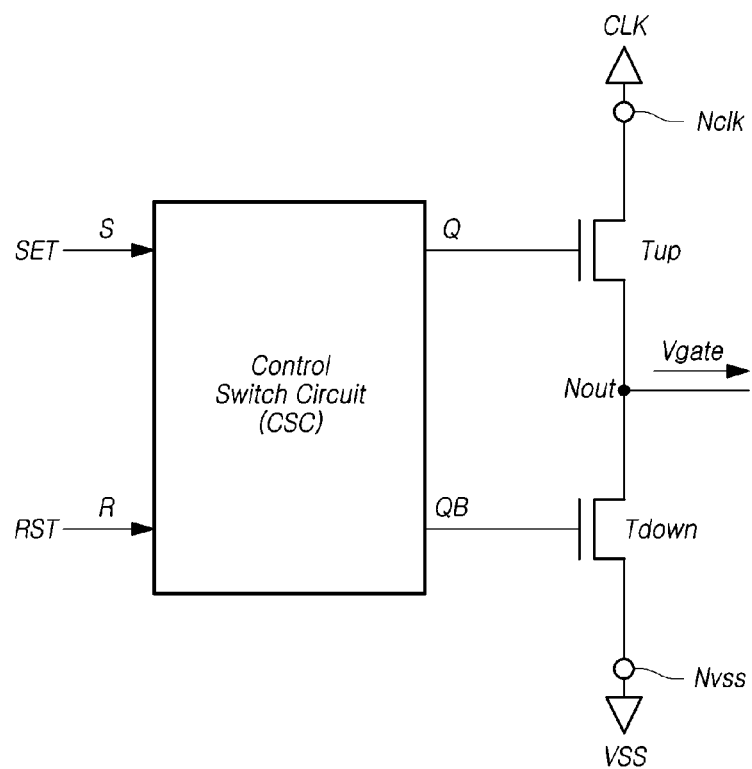
FIG. 5 is a diagram schematically illustrating a gate driving circuit disposed in the panel according to the embodiments of the present disclosure.

FIG. 5 is a diagram schematically illustrating the gate driving circuit GDC disposed in the panel PNL according to the embodiments of the present disclosure.

Referring to FIG. 5, each gate driving circuit GDC may include a pull-up transistor Tup, a pull-down transistor Tdown, a control switch circuit CSC, and the like.

The control switch circuit CSC is a circuit which controls a voltage of a node Q corresponding to a gate node of the pull-up transistor Tup and a voltage of a node QB corresponding to a gate node of the pull-down transistor Tdown and may include several switches (transistors).

The pull-up transistor Tup supplies a gate signal Vgate corresponding to a first level voltage (e.g., a high level voltage VGH) to a gate line GL through a gate signal output node Nout. The pull-down transistor Tdown supplies the gate signal Vgate corresponding to a second level voltage (e.g., a low level voltage VGL) to the gate line GL through the gate signal output node Nout. The pull-up transistor Tup and the pull-down transistor Tdown may be turned on at different timings.

The pull-up transistor Tup is electrically connected between a clock signal application node Nclk to which the clock signal CLK is applied and the gate signal output node Nout electrically connected to the gate line GL and is turned on or off by the voltage of the node Q.

The gate node of the pull-up transistor Tup is electrically connected to the node Q. A drain node or a source node of the pull-up transistor Tup is electrically connected to the clock signal application node Nclk. The source node or the drain node of the pull-up transistor Tup is electrically connected to the gate signal output node Nout from which the gate signal Vgate is output.

The pull-up transistor Tup is turned on by the voltage of the node Q and outputs the gate signal Vgate, which has the high level voltage VGH in a high level period of the clock signal CLK, to the gate signal output node Nout.

The gate signal Vgate of the high level voltage VGH output to the gate signal output node Nout is supplied to the corresponding gate line GL.

The pull-down transistor Tdown is electrically connected between the gate signal output node Nout and a base voltage node Nvss and turned on or off by the voltage of the node QB.

The gate node of the pull-down transistor Tdown is electrically connected to the node QB. A drain node or a source node of the pull-down transistor Tdown is electrically connected to the base voltage node Nvss, and a base voltage VSS which is a constant voltage is applied to the drain node or the source node of the pull-down transistor Tdown connected to the base voltage node Nvss. The source node or the drain node of the pull-down transistor Tdown is electrically connected to the gate signal output node Nout from which the gate signal Vgate is output.

The pull-down transistor Tdown is turned on by the voltage of the node QB and outputs the gate signal Vgate of the low level voltage VGL to the gate signal output node Nout. Accordingly, the gate signal Vgate of the low level voltage VGL may be supplied to the corresponding gate line GL through the gate signal output node Nout. As an example, the gate signal Vgate of the low level voltage VGL may be the base voltage VSS.

Meanwhile, the control switch circuit CSC may include two or more transistors and the like, and main nodes, such as the node Q, the node QB, a set node S (also referred to as "a start node"), and a reset node R, are present therein. In some cases, an input node to which various voltages, such as a driving voltage VDD, are input may be additionally present in the control switch circuit CSC.

In the control switch circuit CSC, the node Q is electrically connected to the gate node of the pull-up transistor Tup and is repeatedly charged and discharged.

In the control switch circuit CSC, the node QB is electrically connected to the gate node of the pull-down transistor Tdown and is repeatedly charged and discharged.

In the control switch circuit CSC, a set signal SET for instructing the corresponding gate driving circuit GDC to start gate driving is applied to the set node S.

The set signal SET applied to the set node S may be a start signal VST input from the outside of the gate driver GDR or a feedback signal (a carry signal) of a gate signal Vgate output from a gate driving circuit GDC in a previous stage of the current gate driving circuit GDC.

A reset signal RST applied to the reset node R in the control switch circuit CSC may be a reset signal for simultaneously intializing the gate driving circuits GDC in all stages or a carry signal input from another stage (the previous or following stage).

The control switch circuit CSC charges the node Q in response to the set signal SET and discharges the node Q in response to the reset signal RST. The control switch circuit CSC may include an inverter circuit to charge or discharge the node Q and the node QB at different timings.

As shown in FIG. 3, in each of the plurality of subpixels SP in the active area A/A of the panel PNL which is an OLED panel, the driving transistor T3 and the switching transistor O-SWT may be disposed. However, the present embodiments are not limited thereto, and as shown in FIG. 4, three or more transistors may be disposed in each of the plurality of subpixels SP in the active area A/A of the panel PNL which is an OLED panel.

Also, when the gate driving circuit GDC is implemented as an GIP type of gate driving circuit as shown in FIG. 2, that is, when the gate driving circuit GDC is embedded in the panel PNL, various transistors (Tup, Tdown, and transistors in the control switch circuit CSC) included in the gate driving circuit GDC as shown in FIG. 5 may be disposed in the non-active area N/A which is an outer area of the active area A/A of the panel PNL.

Figure 6A:
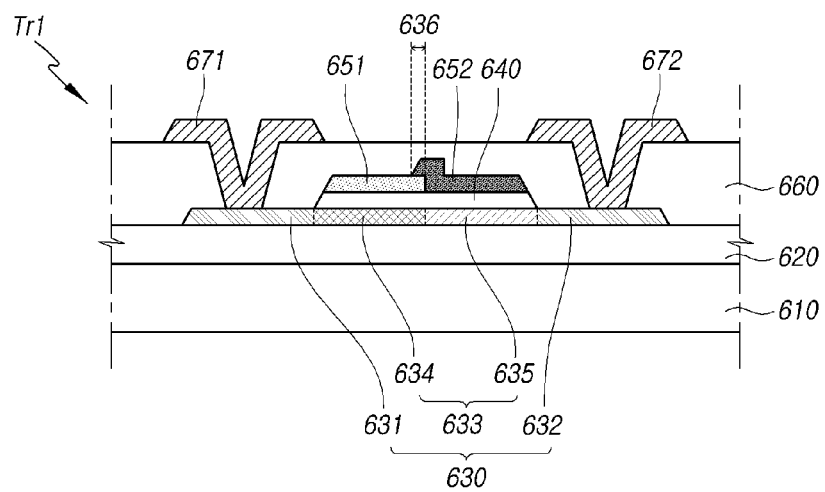
FIG. 6A is a cross-sectional view illustrating a structure of a first thin film transistor (TFT) disposed in the electronic device according to the embodiments of the present disclosure.
Figure 6B:
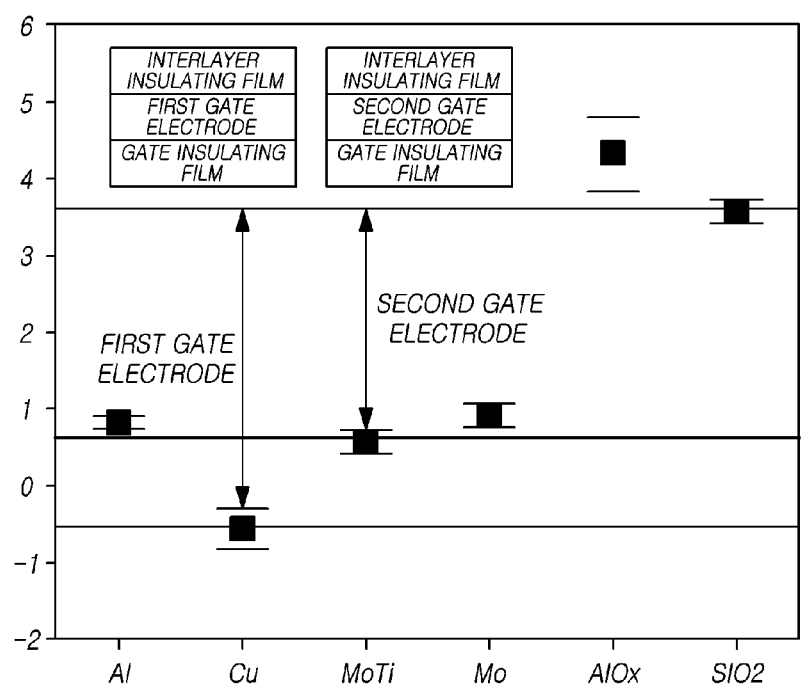
FIGS. 6B and 6C are diagrams illustrating a hydrogen diffusion barrier according to the material of a gate electrode disposed between a gate insulating film and an interlayer insulating film.
Figure 6C:
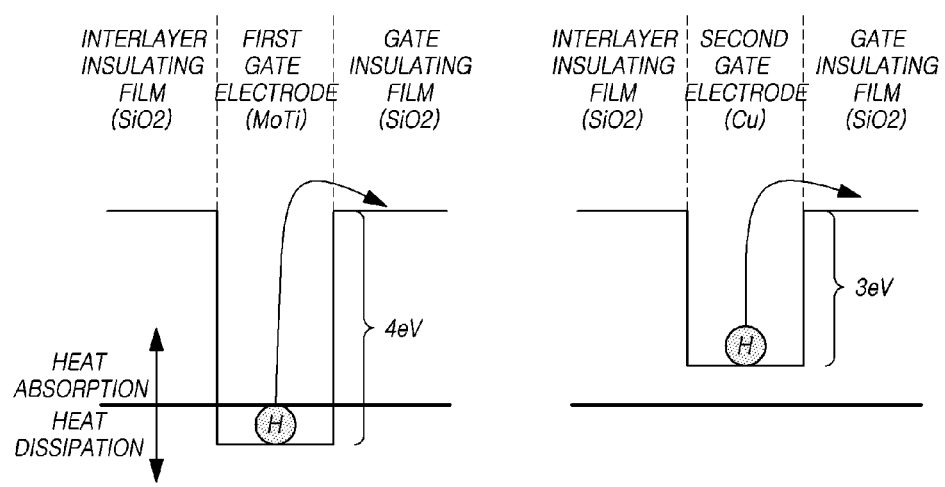
Figure 6D:
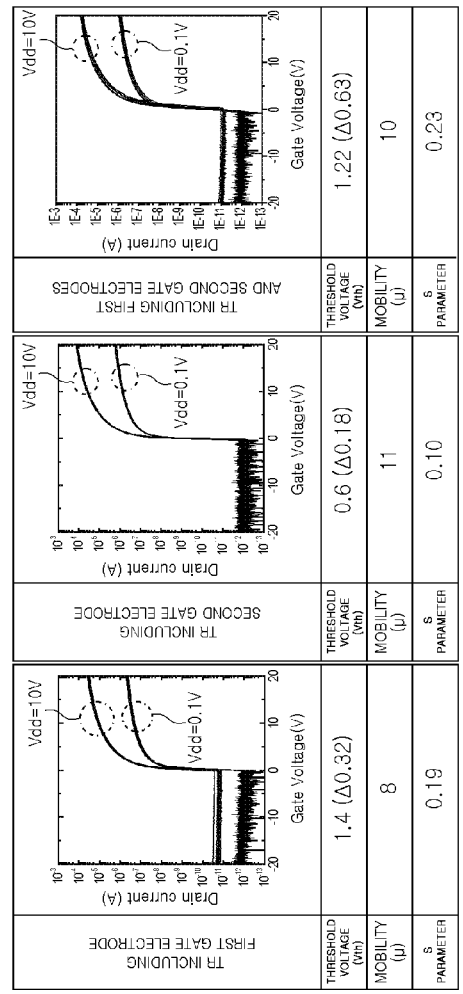
FIG. 6D is a diagram for comparing threshold voltages, mobility, and subthreshold (S) parameters of a TFT derived from a change in the relationship between a gate voltage and a drain current according to the structure and type of a gate electrode.
Figure 6E:
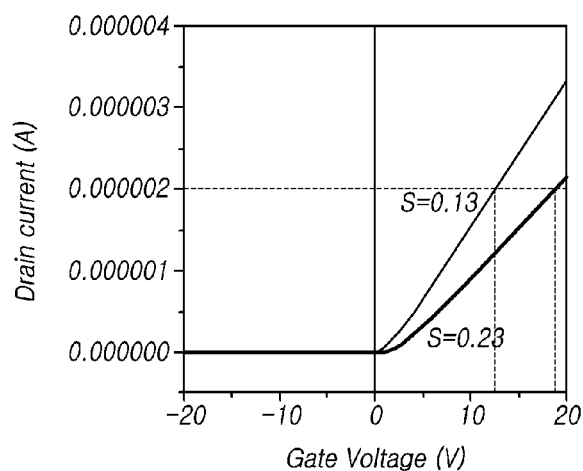
FIG. 6E is a graph showing the relationship between the gate voltage and the drain current of a TFT.

FIG. 6A is a cross-sectional view illustrating a structure of a first thin film transistor (TFT) disposed in the electronic device according to the embodiments of the present disclosure. FIGS. 6B and 6C are diagrams illustrating a hydrogen diffusion barrier according to the material of a gate electrode disposed between a gate insulating film and an interlayer insulating film. FIG. 6D is a diagram for comparing threshold voltages, mobility, and subthreshold (S) parameters of a TFT derived from a change in the relationship between a gate voltage and a drain current according to the structure and type of a gate electrode. FIG. 6E is a graph showing the relationship between the gate voltage and the drain current of a TFT.

Referring to FIG. 6A, the electronic device according to the embodiments of the present disclosure may include at least one first TFT Tr1.

The first TFT Tr1 may include a first active layer 630, a first gate electrode 651, a second gate electrode 652, a first electrode 671, and a second electrode 672.

Specifically, at least one buffer layer may be disposed on a substrate 610.

The buffer layer 620 may include an inorganic insulating material, such as silicon oxide (SiOx), silicon nitride (SiNx), or silicon oxynitride (SiON), but the present disclosure is not limited thereto.

Although the buffer layer 620 is shown as a single layer structure in FIG. 6A, the buffer layer 620 of the present disclosure may have a multi-layer structure.

When the buffer layer 620 has a multi-layer structure, layers including at least two inorganic insulating materials among inorganic insulating materials such as silicon oxide (SiOx), silicon nitride (SiNx), silicon oxynitride (SiON), etc. may be alternately disposed in the structure, but the present disclosure is not limited thereto.

In the following description, for convenience, the buffer layer 620 is assumed to have a single layer structure.

The first active layer 630 of the first TFT Tr1 may be disposed on the buffer layer 620.

Although not shown in FIG. 6A, at least one light-shield layer overlapping the first active layer 630 may be disposed under the first active layer 630 of the first TFT Tr1. The light-shield layer may prevent light from being incident on the first active layer 630 so that electrical characteristics of the first active layer 630 may not be changed.

The first active layer 630 may be formed of an oxide semiconductor. The material of the first active layer 630 is a metal-oxide semiconductor which may be made of an oxide of a metal, such as zinc (Zn), indium (In), gallium (Ga), tin (Sn), or titanium (Ti), or a combination of a metal, such as zinc (Zn), indium (In), gallium (Ga), tin (Sn), or titanium (Ti), and an oxide thereof.

For example, the first active layer 630 may include at least one among zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), but the present disclosure is not limited thereto.

Such an oxide semiconductor can be applied to large-area electronic devices compared to a semiconductor including silicon.

The first active layer 630 may include a first area 631, a second area 632 spaced apart from the first area 631, and a channel area 633 provided between the first area 631 and the second area 632.

A gate insulating film 640 may be disposed on the first active layer 630.

The gate insulating film 640 may include an inorganic insulating material, such as silicon oxide (SiOx), silicon nitride (SiNx), or silicon oxynitride (SiON), but the present disclosure is not limited thereto.

As shown in FIG. 6A, the gate insulating film 640 may be disposed to expose a part of the first active layer 630.

The material of the gate insulating film 640 formed on the substrate 610 is patterned through a dry etching process so that the gate insulating film 640 may be finally disposed on a part of the upper surface of the first active layer 630.

During the process of dry-etching the material of the gate insulating film 640, a partial area of the first active layer 630 may be made conductive. Specifically, an area of the first active layer 630 which is disposed on an area which does not overlap the gate insulating film 640 may be made conductive.

In other words, the first area 631 and the second area 632 of the first active layer 630 which do not overlap the gate insulating film 640 may be conductive areas. Also, the channel area 633 of the first active layer 630 may include an area which is not made conductive.

Then, the area of the channel area 633 of the first active layer 630 which is not made conductive may have a higher electrical resistance than the first area 631 and the second area 632.

When the first TFT Tr1 is turned on, charges may move through the channel area 633 of the first active layer 630.

The first gate electrode 651 and the second gate electrode 652 of the first TFT Tr1 may be disposed on the gate insulating film 640.

The first gate electrode 651 and the second gate electrode 652 may be disposed on the same layer. Therefore, a thickness of the gate insulating film 640 overlapping the first gate electrode 651 and a thickness of the gate insulating film 640 overlapping the second gate electrode 652 may correspond to each other.

An end of the first gate electrode 651 and an end of the second gate electrode 652 may overlap each other. In this case, the end of the first gate electrode 651 and the end of the second gate electrode 652 may be in contact with each other.

A signal corresponding to the first gate electrode 651 may be applied to the second gate electrode 652.

For example, when a first data voltage is applied to the first gate electrode 651, the first data voltage, which is the same voltage as that applied to the first gate electrode 651, may also be applied to the second gate electrode 652.

In other words, the first gate electrode 651 and the second gate electrode 652 may have the same gate node.

Meanwhile, the channel area 633 of the first active layer 630 may overlap the first gate electrode 651 and the second gate electrode 652. Specifically, the first active layer 630 may overlap each of the first gate electrode 651 and the second gate electrode 652. An area of the first active layer 630 overlapping the first gate electrode 651 and the second gate electrode 652 may include an area in which the end of first gate electrode 651 and the end of the second gate electrode 652 overlap each other.

An interlayer insulating film 660 may be disposed on the substrate 610 on which the first gate electrode 651 and the second gate electrode 652 are disposed.

The interlayer insulating film 660 may include an inorganic insulating material, such as silicon oxide (SiOx), silicon nitride (SiNx), or silicon oxynitride (SiON), but the present disclosure is not limited thereto.

The first electrode 671 and the second electrode 672 of the first TFT Tr1 may be disposed apart from each other on the interlayer insulating film 660.

One of the first electrode 671 and the second electrode 672 may be a source electrode of the first TFT Tr1, and the other may be a drain electrode of the first TFT Tr1.

For example, the first electrode 671 may be the source electrode of the first TFT Tr1, and the second electrode 672 may be the drain electrode of the first TFT Tr1, but the present disclosure is not limited thereto. The first electrode 671 may be the drain electrode of the first TFT Tr1, and the second electrode 672 may be the source electrode of the first TFT Tr1.

For convenience of description, it is assumed below that the first electrode 671 is the source electrode of the first TFT Tr1 and the second electrode 672 is the drain electrode of the first TFT Tr1.

Each of the first and second electrodes 671 and 672 of the first TFT Tr1 may be connected to a conductive area of the first active layer 630 in the first TFT Tr1 through a contact hole provided in the interlayer insulating film 660.

For example, as shown in FIG. 6A, the first electrode 671 may be connected to the first area 631 of the first active layer 630, and the second electrode 672 may be connected to the second area 632 of the first active layer 630.

Meanwhile, each of the first electrode 651 and the second electrode 652 of the first TFT Tr1 may include any one among aluminum (Al), copper (Cu), molybdenum (Mo), titanium (Ti), silicon (Si), silver (Ag), gold (Au), and alloys thereof, but the present disclosure is not limited thereto.

As described above, the first active layer 630 of the first TFT Tr1 according to the embodiments of the present disclosure may be an oxide semiconductor.

In the channel area 633 of the first TFT Tr1 including the first active layer 630 which is an oxide semiconductor, charges are generated according to the magnitude of a voltage applied to the first and second gate electrodes 651 and 652, and a Fermi level of the first active layer 630 may be determined. Also, the same energy band may be formed in a direction from the first electrode 671 toward the second electrode 672.

In particular, the charge amount of a TFT including an oxide semiconductor may be determined by a hydrogen content and an oxygen deficiency versus the composition of a metal included in the oxide semiconductor. When the oxygen deficiency of the oxide semiconductor or the hydrogen content therein increases, the mobility of charge may increase.

However, since a threshold voltage (Vth) is moved in the negative direction, it is difficult for the TFT including the oxide semiconductor to have a positive Vth together with high mobility.

Also, since the oxygen deficiency of the TFT including the oxide semiconductor is adjusted according to an arbitrary process, it is difficult to freely select the characteristics of the TFT compared to a TFT including a silicon-based semiconductor of which a Fermi level and an energy band are adjusted by doping with impurities.

In other words, it is possible to adjust the Fermi level and energy band of a transistor including a silicon-based semiconductor by doping with impurities, whereas it is not possible to adjust the Fermi level and energy band of an oxide semiconductor.

In particular, a driving transistor for driving an organic light-emitting device disposed in an active area of a panel (e.g., the driving transistors of FIGS. 3 and 4) requires a high S parameter. Specifically, the driving transistor determines the emission intensity of an organic light-emitting device disposed in the active area A/A of the electronic device, and a large S parameter facilitates control with a voltage applied to the driving transistor and representation of a low grayscale.

The S parameter may be obtained from an S-parameter graph (sub-threshold graph). The S-parameter graph shows a ratio of a variation of the driving current of the driving transistor to a variation of the gate voltage. When the S-parameter graph of the driving transistor has a high gradient, an available data voltage range is small, and thus expression of a low grayscale is difficult.

The gradient of the S-parameter graph may be 1/S-parameter.

In other words, the S-parameter denotes how fast a channel potential is changed when a gate voltage is changed, and a large S-parameter denotes that a channel potential is slowly changed compared to when the S-parameter is small, that is, charges are slowly accumulated when the transistor is turned on.

On the other hand, TFTs other than driving transistors among a plurality of transistors disposed in the panel require high operation speed, and thus a low S parameter is necessary.

In other words, TFTs other than driving transistors (e.g., the first and second transistors of FIGS. 3 and 4 and the pull-up transistor and the pull-down transistor of FIG. 5) require high operation speed, and thus high mobility and a low S parameter are necessary.

Although different characteristics are required depending on TFTs, it is difficult to adjust the charge mobility, Vth, and S parameter that are basic characteristics of a TFT including an oxide semiconductor as desired.

In the embodiments of the present disclosure, the charge mobility, Vth, and S parameter may be adjusted by adjusting the hydrogen content depending on areas of the channel area 633 included in the first active layer 630 of the first TFT Tr1.

The channel area 633 of the first active layer 630 of the first TFT Tr1 may include hydrogen. The channel area 633 may have different hydrogen contents depending on the areas thereof.

Specifically, the channel area 633 may include a first channel area 634 and a second channel area 635 which is integrated with the first channel area 634. Since the end of the first gate electrode 651 and the end of the second gate electrode 652 are disposed to overlap each other, the first and second channel areas 634 and 635 of the first active layer 630 disposed under the first and second gate electrodes 651 and 652 may be integrated.

The first channel area 634 and the second channel area 635 may have different hydrogen contents.

As described above, at least one insulating film (e.g., a gate insulating film and an interlayer insulating film) may be disposed on the first active layer 630, and at least one insulating film (e.g., a buffer layer) may also be disposed under the first active layer 630.

The interlayer insulating film 660 disposed on the first active layer 630 may include hydrogen. Also, during a process of forming the interlayer insulating film 660, hydrogen gas and the like may be included in the chamber so that the first active layer 630 may be affected.

Meanwhile, the first gate electrode 651 and the second gate electrode 652 may include different materials.

Each of the first gate electrode 651 and the second gate electrode 652 may include any one among aluminum (Al), copper (Cu), molybdenum (Mo), titanium (Ti), silicon (Si), silver (Ag), gold (Au), and alloys thereof, but the present disclosure is not limited thereto.

As shown in FIG. 6B, since the first gate electrode 651 and the second gate electrode 652 include different materials, the first gate electrode 651 and the second gate electrode 652 may have different hydrogen diffusion barriers. For example, hydrogen bonding may be easier in the first and second gate electrodes 651 and 652 than in an adjacent layer (e.g., the gate insulating film or the interlayer insulating film). In this case, when hydrogen bonded to the first and second gate electrodes 651 and 652 is diffused to the adjacent layer, an energy barrier (hydrogen diffusion barrier) works. In other words, energy is required to separate hydrogen bonded to the first and second gate electrodes 651 and 652 so that the hydrogen bonded to the first and second gate electrodes 651 and 652 may be diffused to the adjacent layer.

The energy required to separate the hydrogen bonded to the first and second gate electrodes 651 and 652 may be hydrogen formation energy of FIG. 6B. In other words, hydrogen formation energy may indicate energy required for hydrogen absorbed by the materials of the first and second gate electrodes 651 and 652 to be released (e.g., energy required for an endothermic reaction).

High hydrogen formation energy denotes that there is a high energy barrier for hydrogen diffusion into another configuration and thus hydrogen diffusion into a gate electrode may be difficult.

For example, it is assumed that the first gate electrode 651 includes an ahoy of molybdenum (Mo) and titanium (Ti) and the second gate electrode 652 includes copper (Cu). As shown in FIG. 6B, the hydrogen formation energy of copper (Cu) may be about 0.5 eV, and the hydrogen formation energy of the alloy of molybdenum (Mo) and titanium (Ti) may be about −0.5 eV.

Also, when the gate insulating film 640 and the interlayer insulating film 660 include silicon oxides (SiOx), the hydrogen formation energy may be about 3.5 eV.

In this case, the hydrogen diffusion barrier of copper (Cu), that is, the second gate electrode 652, may be 3.0 eV, and the hydrogen diffusion barrier of the alloy of molybdenum (Mo) and titanium (Ti), that is, the first gate electrode 651, may be 4.0 eV.

In other words, since the alloy of molybdenum (Mo) and titanium (Ti) has a higher hydrogen diffusion barrier than copper (Cu), hydrogen diffusion may be more difficult in the first gate electrode 651 including the alloy of molybdenum (Mo) and titanium (Ti) than in the second gate electrode 652 including copper (Cu).

As such, hydrogen is diffused through each of the first and second gate electrodes 651 and 652 and may be finally present in the channel area 633.

Specifically, hydrogen diffused through the first gate electrode 651 may reach the first channel area 634 overlapping the first gate electrode 651, and hydrogen diffused through the second gate electrode 652 may reach the second channel area 635 overlapping the second gate electrode 652.

Meanwhile, the hydrogen content of an area 636 in which the channel area 633 overlaps the first and second gate electrodes 651 and 652 may be determined by a gate electrode having a high hydrogen diffusion barrier between the first gate electrode 651 and the second gate electrode 652. For example, when the first gate electrode 651 has a high hydrogen diffusion barrier, the area 636 in which the channel area 633 overlaps the first and second gate electrodes 651 and 652 may be included in the first channel area 634.

The lengths of the first channel area 634 and the second channel area 635 of the first active layer 630 may correspond to each other. The lengths of the first and second channel areas 634 and 635 may be the shortest lengths in a direction perpendicular to a direction in which the first active layer 630 and the gate insulating film 640 are stacked.

As described above, the first and second gate electrodes 651 and 652 have different hydrogen diffusion barriers, and thus hydrogen contents in the first and second channel areas 634 and 635 may also be different.

When the hydrogen diffusion barrier of the first gate electrode 651 is higher than the hydrogen diffusion barrier of the second gate electrode 652, the second gate electrode 652 has a higher hydrogen diffusion capability than the first gate electrode 651. Therefore, the second channel area 635 disposed under the second gate electrode 652 may have a higher hydrogen content than the first channel area 634 disposed under the first gate electrode 651.

Therefore, the amounts of hydrogen included in the channel area 633 of the first active layer 630 may vary depending on areas. Since hydrogen present in the channel area 633 of the first active layer 630 which is an oxide semiconductor may serve as a carrier, carrier concentrations may vary depending on the areas of the channel area 633.

Consequently, characteristics of a TFT having one gate electrode may differ from characteristics of the first TFT Tr1 having the structure shown in FIG. 6A.

Referring to FIG. 6D, it is possible to see the Vth, mobility, and S parameter of each of a TFT in which only a first gate electrode is disposed on one active layer, a TFT in which only a second gate electrode is disposed on one active layer, and the first TFT having the structure of FIG. 6A.

The first gate electrode of the TFT in which only the first gate electrode is disposed on one active layer may include a material corresponding to the first gate electrode 651 of FIG. 6A, and the second gate electrode of the TFT in which only the second gate electrode is disposed on one active layer may include a material corresponding to the second gate electrode 652 of FIG. 6A.

The active layer of each TFT of FIG. 6D may be an oxide semiconductor in which hydrogen may serve as a carrier.

When the hydrogen diffusion barrier of the material of the second gate electrode is lower than the hydrogen diffusion barrier of the material of the first gate electrode, the TFT including only the second gate electrode may have a higher mobility than the TFT including only the first gate electrode as shown in FIG. 6D.

The TFT including only the second gate electrode may have a lower Vth than the TFT including only the first gate electrode. This may denote that the Vth of the TFT including only the second gate electrode has a negative value comparing to the Vth of the TFT including only the first gate electrode.

The TFT including only the second gate electrode may have a smaller S parameter than the TFT including only the first gate electrode.

The mobility of a TFT may be in a trade-off relationship with the Vth and the S parameter. For this reason, it is difficult for a TFT to have a small S parameter while having an appropriate mobility and a positive Vth value.

On the other hand, the first TFT having the structure of FIG. 6A has a Vth value similar to that of the TFT including only the first gate electrode, a mobility similar to that of the TFT including only the second gate electrode, and an S parameter greater than those of the TFTs including only one gate electrode.

In other words, the first TFT having the structure of FIG. 6A may have a positive Vth value and a high S parameter while having an appropriate mobility.

Also, referring to FIG. 6E, when the S parameter increases from 0.13 to 0.23, it can be seen that the margin of a gate voltage, which determines a current for grayscale representation of an OLED disposed in the panel, increases by 150% or more.

In FIG. 6D, the S parameter of the TFT including only the second gate electrode is 0.10, and the S parameter of the first TFT having the structure of FIG. 6A is 0.23. Therefore, it can be seen that the margin of a gate voltage, which determines a current for grayscale representation of an OLED, of the first TFT increases by 150% or more compared to the margin of a gate voltage of the TFT including only the second gate electrode.

Meanwhile, in FIG. 6D, the x-axis denotes a gate voltage, and the y-axis denotes a drain current.

In FIG. 6D, to measure characteristics of each TFT, a drain current was measured while a gate voltage within a range from −20V to +20V was applied. Also, driving voltages VDD of 0.1V and 10V were applied to each TFT.

As described above, the first channel area 634 and the second channel area 635 having different Fermi levels in a horizontal direction are present in the channel area 633 of the first active layer 630 of FIG. 6A, and the first channel area 634 and the second channel area 635 are integrated. Therefore, the first and second channel areas 634 and 635 having different Fermi levels can be combined in series. The horizontal direction may be a direction perpendicular to a direction in which the first active layer 630 and the gate insulating film 640 are stacked.

Since the first and second channel areas 634 and 635 have different Fermi levels, the energy band may bend at the boundary between the first and second channel areas 634 and 635.

This will be described below with reference to FIGS. 7 to 10.

FIGS. 7 to 10 show the energy level of the channel area in the first active layer of the first TFT of FIG. 6A.

In the following description, details (configuration, effects, etc.) which are the same as those of the above-described embodiments may be omitted.

As described above, the channel area 633 of the first active layer 630 in the first TFT Tr1 of FIG. 6A may include the first channel area 634 and the second channel area 635 having different Fermi levels.

At the boundary between the first channel area 634 and the second channel area 635 which are integrated with each other, the energy band may bend so that the Fermi level may be kept flat in an equilibrium state.

For example, when the hydrogen content of the first channel area 634 is lower than the hydrogen content of the second channel area 635, the energy band may bend from a high level to a low level from the first channel area 634 toward the second channel area 635 in the channel area overlapping the first and second gate electrodes 651 and 652.

Also, since the first gate electrode 651 and the second gate electrode 652 include different materials, the first gate electrode 651 and the second gate electrode 652 may have different work functions.

The energy band may bend in the channel area 633 of the first active layer 630 in which the first and second gate electrodes 651 and 652 correspond to the area in which the first and second electrodes 671 and 672 overlap.

Specifically, when different electrodes having a large difference in work function are disposed to overlap each other, the energy band may bend due to a vacuum-level shift in the first active layer 630 disposed in an area corresponding to an area in which the different electrodes overlap.

For example, when the work function of the first gate electrode 651 is higher than the work function of the second gate electrode 652, the energy band may bend from a high level to a low level from the first channel area 634 toward the second channel area 635 so that the Fermi level may be kept flat in an area of the channel area 633 of the first active layer overlapping both the first and second gate electrodes 651 and 652.

Figure 7:
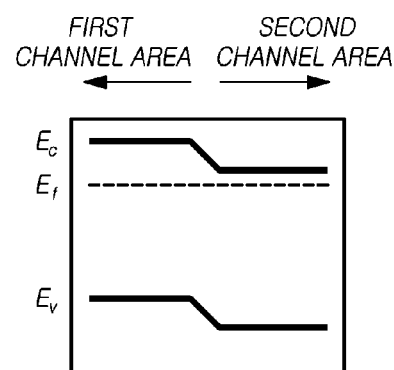
FIGS. 7 to 10 show an energy level of a channel area in a first active layer of the first TFT of FIG. 6A according to the embodiments of the present disclosure.
Figure 8:
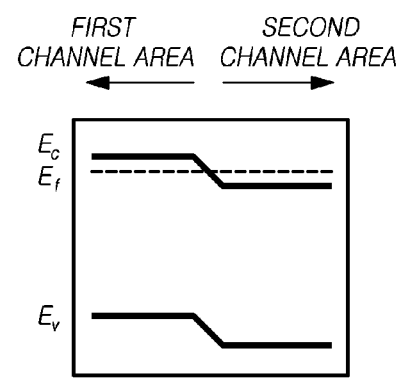

Meanwhile, as shown in FIGS. 7 and 8, when the first channel area 634 has a low hydrogen content and the second channel area 635 has a high hydrogen content, the gap between a conduction band $E_c$ and a Fermi level $E_f$ of the first channel area 634 may be larger than the gap between the conduction band and the Fermi level of the second channel area 635.

When carriers are moved from the first channel area 634 toward the second channel area 635 in the first active layer 630, the first channel area 634 may be a factor which determines the Vth of the first TFT Tr1. In the following description, a configuration in which carriers are moved from the first channel area 634 toward the second channel area 635 will be mainly described for convenience of description.

With a reduction in the gap between the conduction band and the Fermi level of the first channel area 634, the Vth of the first TFT Tr1 may be moved in the positive direction.

Referring to FIGS. 7 and 8, the Vth of the first TFT Tr1 having the first channel area 634 of FIG. 8 may have a positive value comparing to the Vth of the first TFT Tr1 having the first channel area 634 of FIG. 7.

Also, since the conduction band of the second channel area 635 of FIG. 8 is lower in position than the Fermi level, the second channel area 635 may have conductor characteristics. Therefore, only the first channel area 634 of the first TFT Tr1 of FIG. 8 serves as a substantial channel area so that the first active layer 630 may have a short channel. In this case, carrier mobility in the channel area 633 of the first active layer 630 of FIG. 8 may be greater than carrier mobility in the channel area 633 of the first active layer 630 of FIG. 7.

Meanwhile, with an increase in carrier mobility, the S parameter of the transistor may be reduced.

As described above, with an increase in the accumulation speed of charge, the S parameter of the transistor is reduced, and a high carrier mobility may denote a high charge accumulation speed.

Therefore, the first TFT Tr1 of FIG. 8 may be used as a TFT (e.g., the first and second transistors of FIGS. 3 and 4 and the pull-up transistor and pull-down transistor of FIG. 5) other than a driving transistor.

The first TFT Tr1 of FIG. 7 has a lower carrier mobility than the first TFT Tr1 of FIG. 8, and thus the S parameter may be relatively large. Therefore, in terms of S parameter, the first TFT Tr1 of FIG. 7 may be more suitable for being used as a driving transistor than the first TFT Tr1 of FIG. 8.

Figure 9:
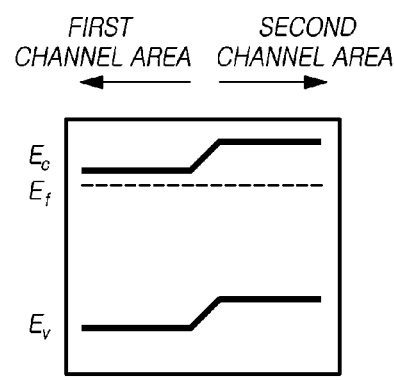
Figure 10:
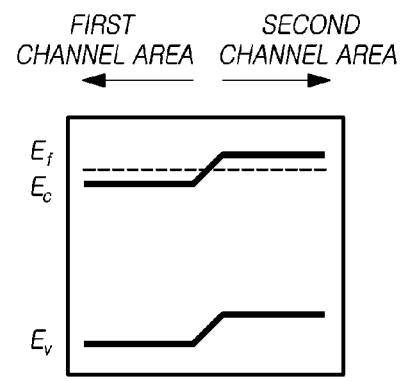

Also, as shown in FIGS. 9 and 10, when the hydrogen content of the first channel area 634 is high and the hydrogen content of the second channel area 635 is low, the gap between the conduction band $E_c$ and the Fermi level $E_f$ of the first channel area 634 may be smaller than the gap between the conduction band and the Fermi level of the second channel area 635. Meanwhile, in the case of the first channel area 634 of FIG. 10, the position of the Fermi level is higher than that of the conduction band, and thus there is no gap between the conduction band and the Fermi level.

For this reason, the Vth of the first TFT Tr1 of FIG. 10 may have a positive value comprating to the Vth of the first TFT Tr1 of FIG. 9.

Also, since the conduction band of the first channel area 634 of the first TFT Tr1 of FIG. 10 is lower in position than the Fermi level, the first channel area 634 may have conductor characteristics. Therefore, only the second channel area 635 of the first TFT Tr1 of FIG. 10 serves as a substantial channel area so that the first active layer 630 may have a short channel. In other words, it is possible to adjust the length of a channel area without an additional process.

In this case, carrier mobility in the channel area 633 of the first active layer 630 of FIG. 10 may be greater than carrier mobility in the channel area 633 of the first active layer 630 of FIG. 9.

However, the energy band bends to a higher energy level from the first channel area 634 toward the second channel area 635 in an area corresponding to the boundary between the first and second channel areas 634 and 635 of FIG. 10. Therefore, when carriers are moved from the first channel area 634 toward the second channel area 635, it may be more difficult for carriers to be moved from the first channel area 634 toward the second channel area 635 of FIG. 10 than to be moved from the first channel area 634 toward the second channel area 635 of FIG. 8.

In other words, carrier mobility in the channel area of FIG. 8 may be higher than carrier mobility in the channel area of FIG. 10 and thus the first TFT Tr1 of FIG. 10 may have a smaller S parameter than the first TFT Tr1 of FIG. 8.

As such, it is possible to appropriately adjust the mobility, Vth, and S parameter of the first TFT Tr1 by variously adjusting the hydrogen contents of the first and second channel areas 634 and 635 of the first active layer 630.

Meanwhile, a structure in which the length of the first channel area 634 of the first active layer 630 corresponds to the length of the second channel area 635 has been mainly described above with reference to FIGS. 6A to 10, but the present disclosure is not limited thereto.

For example, the first channel area 634 and the second channel area 635 of the first active layer 630 may have different lengths.

This will be described below with reference to FIGS. 11 and 12.

Figure 11:
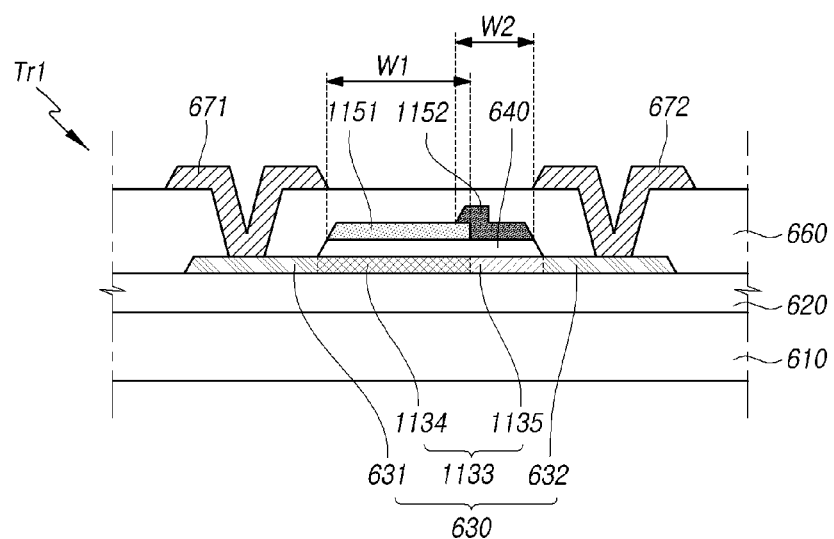
FIGS. 11 and 12 are cross-sectional views illustrating structure of first TFTs disposed in an electronic device according to other embodiments of the present disclosure.
Figure 12:
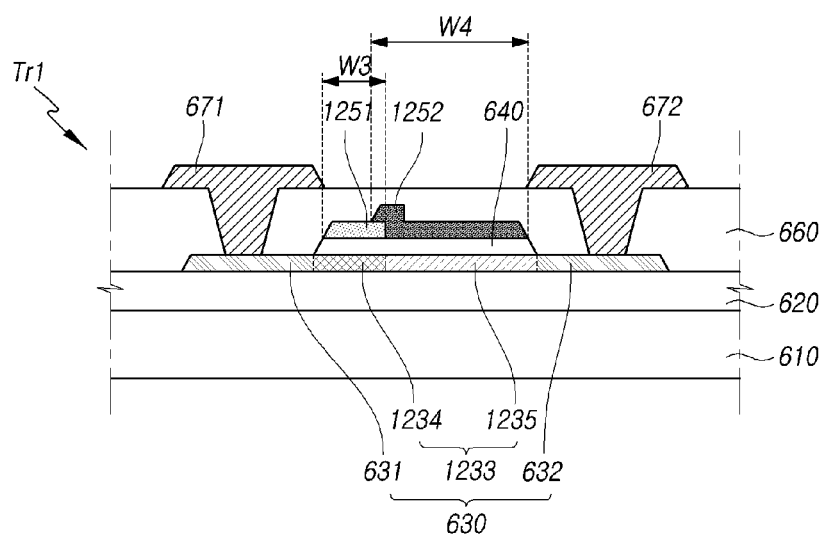

FIGS. 11 and 12 are cross-sectional views illustrating structures of first TFTs disposed in an electronic device according to other embodiments of the present disclosure.

In the following description, details (configuration, effects, etc.) which are the same as those of the above-described embodiments may be omitted.

Referring to FIGS. 11 and 12, first TFTs Tr1 disposed in the electronic device according to the other embodiments of the present disclosure may include first active layers 630, first gate electrodes 1151 and 1251, second gate electrodes 1152 and 1252, first electrodes 671, and second electrodes 672.

Like the above-described embodiments, a configuration in which the hydrogen diffusion barriers of the first gate electrodes 1151 and 1251 are higher than the hydrogen diffusion barriers of the second gate electrodes 1152 and 1252 will be mainly described below.

Lengths W1 and W3 of the first gate electrodes 1151 and 1251 may differ from lengths W2 and W4 of the second gate electrodes 1152 and 1252. The lengths W1 and W3 of the first gate electrodes 1151 and 1251 and the lengths W2 and W4 of the second gate electrodes 1152 and 1252 may be the shortest lengths in a direction perpendicular to a direction in which the first active layers 630 and the gate insulating films 640 are stacked.

For example, as shown in FIG. 11, the length W1 of the first gate electrode 1151 may be greater than the length W2 of the second gate electrode 1152. However, this is only one of embodiments of the present disclosure, and as shown in FIG. 12, the length W4 of the second gate electrode 1252 may be greater than the length W3 of the first gate electrode 1251.

For this reason, as shown in FIGS. 11 and 12, first channel areas 1134 and 1234 and second channel areas 1135 and 1235 of channel areas 1133 and 1233 of the first active layers 630 overlapping the first gate electrodes 1151 and 1251 and the second gate electrodes 1152 and 1252 may have different lengths.

As shown in FIG. 11, when the length W1 of the first gate electrode 1151 is greater than the length W2 of the second gate electrode 1152, the length of the first channel area 1134 may be greater than the length of the second channel area 1135.

Also, as shown in FIG. 12, when the length W4 of the second gate electrode 1252 is greater than the length W3 of the first gate electrode 1251, the length of the second channel area 1235 may be greater than the length of the first channel area 1234.

The lengths of the first channel areas 1134 and 1234 and the second channel areas 1135 and 1235 of the first active layers 630 may be major factors for determining the characteristics of the first TFTs Tr1 together with a hydrogen content in each channel area.

Characteristics of a first TFT according to the hydrogen content in each channel area and the length of each channel area will be described below.

FIGS. 13 to 16 show the energy level of the channel area of the first active layer of the first TFT of FIG. 11. FIGS. 17 to 20 show the energy level of the channel area of the first active layer of the first TFT of FIG. 12.

In the following description, details (configuration, effects, etc.) which are the same as those of the above-described embodiments may be omitted.

A configuration in which carriers are moved from the first channel area 1134 toward the second channel area 1135 will be mainly described below with reference to FIGS. 13 to 20.

Figure 13:
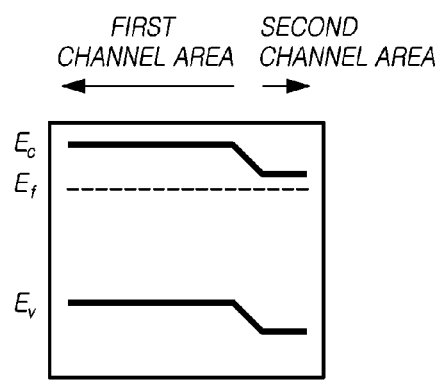
FIGS. 13 to 16 show an energy level of a channel area in a first active layer of the first TFT of FIG. 11 according to the embodiments of the present disclosure.
Figure 14:
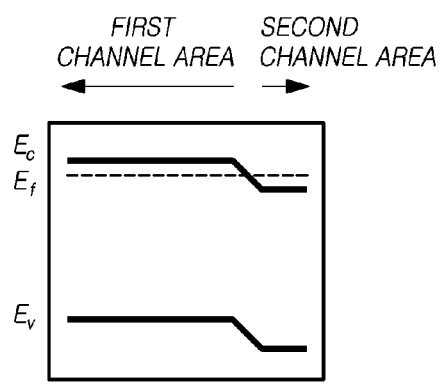

Referring to FIG. 14, with an reduction in the gap between the conduction band and the Fermi level of the first channel area 1134, the Vth of the first TFT Tr1 may be moved in the positive direction. Therefore, the Vth of the first TFT Tr1 having the first channel area 1134 of FIG. 14 may have a positive value comparing to the Vth of the first TFT Tr1 having the first channel area 1134 of FIG. 13.

Meanwhile, as described above, the first channel area 1134 is a factor for determining the Vth of the first TFT Tr1, and the Vth of the first TFT Tr1 may also vary according to a change in the length of the first channel area 1134.

For example, since the first channel area 1134 of FIG. 14 has a greater length than the first channel area 634 of FIG. 8, the Vth of the first TFT Tr1 of FIG. 14 may have a positive value comparing the Vth of the first TFT Tr1 of FIG. 8.

Also, since the conduction band is lower in position than the Fermi level in the second channel area 1135 of FIG. 14, the second channel area 1135 may have conductor characteristics. Therefore, only the first channel area 1134 of the first TFT Tr1 of FIG. 14 serves as a substantial channel area, and thus it is possible to have a channel shorter than the channel area 1133 (see FIG. 11) of the first active layer 630.

In other words, carrier mobility in the channel area 1133 of the first active layer 630 of FIG. 14 may be greater than carrier mobility in the channel area 1133 of the first active layer 630 of FIG. 13. Therefore, the first TFT Tr1 of FIG. 13 may have a greater S parameter than the first TFT Tr1 of FIG. 14.

However, the second channel area 1135 of the first active layer 630 of FIG. 14 has a smaller length than the second channel area 635 of the first active layer 630 of FIG. 8, and thus the first active layer 630 of FIG. 14 may have a longer channel area than the first active layer 630 of FIG. 8.

Therefore, carrier mobility in the channel area 1133 of the first active layer 630 of FIG. 14 may be lower than carrier mobility in the channel area 633 of the first active layer 630 of FIG. 8. Consequently, the first TFT Tr1 of FIG. 14 may have a greater S parameter than the first TFT Tr1 of FIG. 8.

In other words, the first TFT Tr1 of FIG. 14 has a relatively high S parameter while having a positive Vth and thus can be used as a driving transistor.

Figure 15:
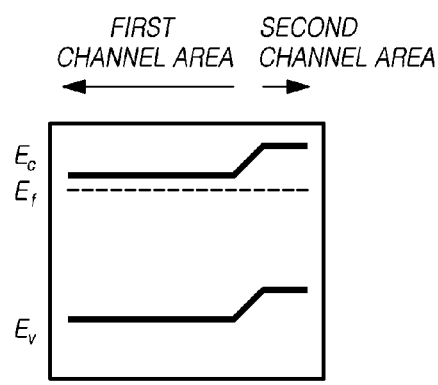
Figure 16:
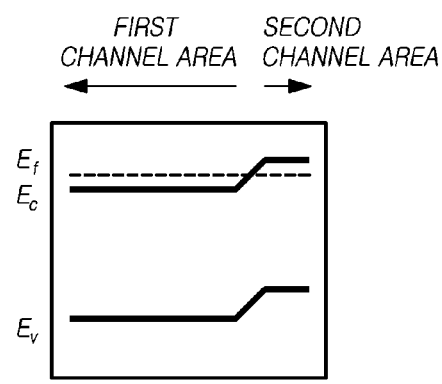

Also, as shown in FIGS. 15 and 16, when the first channel area 1134 has a high hydrogen content and the second channel area 1135 has a low hydrogen content, the gap between the conduction band and the Fermi level of the first channel area 1134 may be smaller than the gap between the conduction band and the Fermi level of the second channel area 1135. Meanwhile, in the case of the first channel area 1134 of FIG. 16, the position of the Fermi level is higher than that of the conduction band, and thus there is no gap between the conduction band and the Fermi level.

For this reason, the Vth of the first TFT Tr1 of FIG. 16 may have a positive value comparing to the Vth of the first TFT Tr1 of FIG. 15.

Since the conduction band is lower in position than the Fermi level in the first channel area 1134 of the first TFT Tr1 of FIG. 16, the first channel area 1134 may have conductor characteristics. Therefore, only the second channel area 1135 of the first TFT Tr1 of FIG. 16 serves as a substantial channel area so that the first active layer 630 may have a short channel.

In this case, carrier mobility in the channel area 1133 of the first active layer 630 of FIG. 16 may be greater than carrier mobility in the channel area 1133 of the first active layer 630 of FIG. 15.

Then, a barrier works for carriers moving from the first channel area 1134 to the second channel area 1135, and thus the first TFT Tr1 of FIG. 15 may have a greater S parameter than the first TFT Tr1 of FIG. 16. Also, since the gap between the conduction band and the Fermi level of the first channel area 1134 of FIG. 15 is not large, the Vth may have a positive value. Therefore, the first TFT Tr1 of FIG. 15 may be used as a driving transistor, but the present disclosure is not limited thereto.

However, the energy band bends to a higher energy level from the first channel area 1134 toward the second channel area 1135 in an area corresponding to the boundary between the first and second channel areas 1134 and 1135 of FIG. 16. Therefore, when carriers are moved from the first channel area 1134 toward the second channel area 1135, it may be more difficult for carriers to be moved from the first channel area 1134 toward the second channel area 1135 of FIG. 16 than to be moved from the first channel area 1134 toward the second channel area 1135 of FIG. 14.

In other words, carrier mobility in the channel area of FIG. 14 may be higher than carrier mobility in the channel area of FIG. 16 so that the first TFT Tr1 of FIG. 16 may have a smaller S parameter than the first TFT Tr1 of FIG. 14.

As such, it is possible to appropriately adjust the mobility, Vth, and S parameter of the first TFTs Tr1 by variously adjusting the hydrogen contents of the first channel areas 1134 and 1234 and the second channel areas 1135 and 1235 of the first active layers 630.

Figure 17:
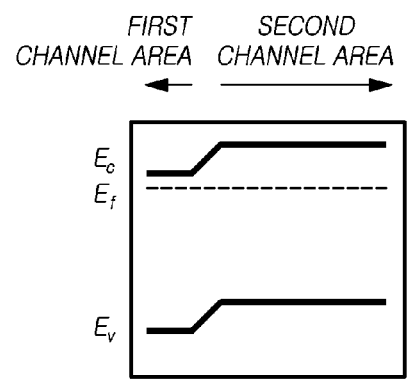
FIGS. 17 to 20 show an energy level of a channel area in a first active layer of the first TFT of FIG. 12 according to the embodiments of the present disclosure.
Figure 18:
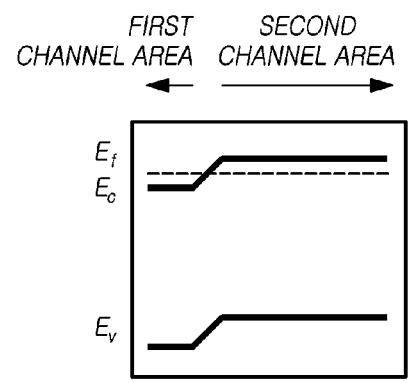

Referring to FIG. 18, with a reduction in the gap between the conduction band and the Fermi level of the first channel area 1234, the Vth of the first TFT Tr1 may be moved in the positive direction. Therefore, the Vth of the first TFT Tr1 having the first channel area 1234 of FIG. 18 may have a positive value comparing to the Vth of the first TFT Tr1 having the first channel area 1234 of FIG. 17.

As described above, the first channel area 1234 is a factor for determining the Vth of the first TFT Tr1, and the Vth of the first TFT Tr1 may also vary according to a change in the length of the first channel area 1234.

For example, when the first channel area 1234 of FIG. 18 has a smaller length than the first channel area 1134 of FIG.

14, the Vth of the first TFT Tr1 of FIG. 14 may have a positive value comparing to the Vth of the first TFT Tr1 of FIG. 18.

Also, since the conduction band is lower in position than the Fermi level in the first channel area 1234 of FIG. 18, the first channel area 1234 of FIG. 18 may have conductor characteristics. Therefore, only the second channel area 1235 of the first TFT Tr1 of FIG. 18 serves as a substantial channel area, and thus it is possible to have a channel shorter than the channel area 1233 (see FIG. 12) of the first active layer 630.

In other words, carrier mobility in the channel area 1233 of the first active layer 630 of FIG. 18 may be greater than carrier mobility in the channel area 1233 of the first active layer 630 of FIG. 17. Therefore, the first TFT Tr1 of FIG. 17 may have a greater S parameter than the first TFT Tr1 of FIG. 18.

For this reason, the first TFT Tr1 of FIG. 18 may be used not as a driving transistor but as a transistor for transferring a signal to a driving transistor or a transistor disposed in a non-active area of a panel, but the present disclosure is not limited thereto.

The second channel area 1235 of the first active layer 630 of FIG. 18 has a greater length than the second channel area 1135 of the first active layer 630 of FIG. 14, and thus the first active layer 630 of FIG. 14 may have a shorter channel area than the first active layer 630 of FIG. 18.

Therefore, carrier mobility in the channel area 1133 of the first active layer 630 of FIG. 14 may be higher than carrier mobility in the channel area 1233 of the first active layer 630 of FIG. 18. Consequently, the first TFT Tr1 of FIG. 18 may have a greater S parameter than the first TFT Tr1 of FIG. 14.

However, since the first channel area 1234 of the first active layer 630 of FIG. 18 has a smaller length than the first channel area 1134 of the first active layer 630 of FIG. 14, the Vth of the first TFT Tr1 of FIG. 14 may have a positive value comparing to the Vth of the first TFT Tr1 of FIG. 18.

Figure 19:
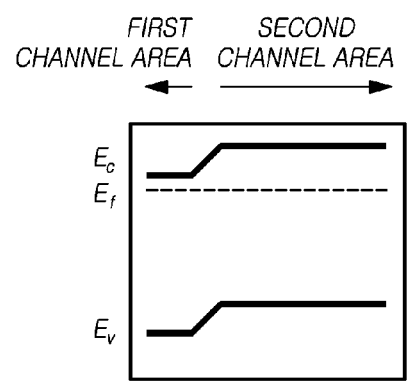
Figure 20:
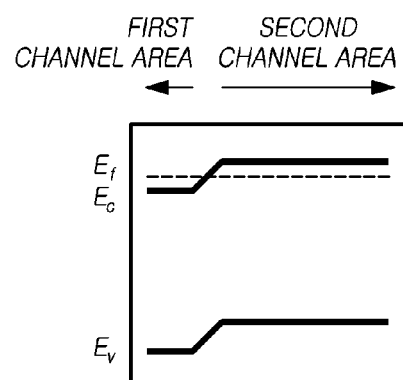

Also, as shown in FIGS. 19 and 20, when the first channel area 1234 has a high hydrogen content and the second channel area 1235 has a low hydrogen content, the gap between the conduction band and the Fermi level of the first channel area 1234 may be smaller than the gap between the conduction band and the Fermi level of the second channel area 1235. Meanwhile, in the case of the first channel area 1234 of FIG. 20, the position of the Fermi level is higher than that of the conduction band, and thus there is no gap between the conduction band and the Fermi level.

For this reason, the Vth of the first TFT Tr1 of FIG. 20 may have a positive value comparing to the Vth of the first TFT Tr1 of FIG. 19.

Since the conduction band is lower in position than the Fermi level in the first channel area 1234 of FIG. 20, the first channel area 1234 may have conductor characteristics. Therefore, only the second channel area 1235 of the first TFT Tr1 of FIG. 20 serves as a substantial channel area so that the first active layer 630 may have a short channel.

In this case, carrier mobility in the channel area 1233 of the first active layer 630 of FIG. 20 may be greater than carrier mobility in the channel area 1233 of the first active layer 630 of FIG. 19.

However, the energy band bends to a higher level from the first channel area 1234 toward the second channel area 1235 in an area corresponding to the boundary between the first and second channel areas 1234 and 1235 of FIG. 20. Therefore, when carriers are moved from the first channel area 1234 toward the second channel area 1235, it may be more difficult for carriers to be moved from the first channel area 1234 toward the second channel area 1235 of FIG. 20 than to be moved from the first channel area 1234 toward the second channel area 1235 of FIG. 18.

In other words, carrier mobility in the channel area of FIG. 18 may be higher than carrier mobility in the channel area of FIG. 20 so that the first TFT Tr1 of FIG. 20 may have a smaller S parameter than the first TFT Tr1 of FIG. 18.

As such, it is possible to appropriately adjust the mobility, Vth, and S parameter of the first TFTs Tr1 by variously adjusting the hydrogen contents of the first channel areas 1134 and 1234 and the second channel areas 1135 and 1235 of the first active layers 630.

The lengths of the above-described first and second channel areas and the energy level of each channel area are only examples, and the length and energy level of each channel area may be appropriately adjusted according to the position and role of a TFT.

For example, when the first TFTs Tr1 are the driving transistors shown in FIGS. 3 and 4, the first and second channel areas of the first active layers 630 may be appropriately designed to obtain a positive Vth value and a high S parameter.

When the first TFTs Tr1 are at least one of the first and second transistors of FIGS. 3 and 4 and the pull-up transistor and the pull-down transistor of FIG. 5, the first and second channel areas of the first active layers 630 may be appropriately designed to obtain high mobility and a low S parameter.

For example, although not shown in the drawings of the present disclosure, when each of the first and second gate electrodes has a low hydrogen diffusion barrier, a TFT having a high hydrogen content in the first and second channel areas may be used as at least one of the first and second transistors of FIGS. 3 and 4 and the pull-up transistor and the pull-down transistor of FIG. 5.

As described above, when the first and second gate electrodes of the first TFT include materials having different hydrogen formation energies, areas may have different hydrogen contents in one channel area provided in one active layer, and thus the energy band may bend in the single channel area.

In other words, the embodiments of the present disclosure only require a configuration in which each of the first and second gate electrodes of the first TFT includes materials having different hydrogen formation energies, that is, structures which may have different hydrogen diffusion barriers.

Meanwhile, when the first TFTs Tr1 are the driving transistors shown in FIGS. 3 and 4, the first or second electrodes of the first TFTs Tr1 may be electrically connected to other electrodes.

This will be described below with reference to FIG. 21.

Figure 21:
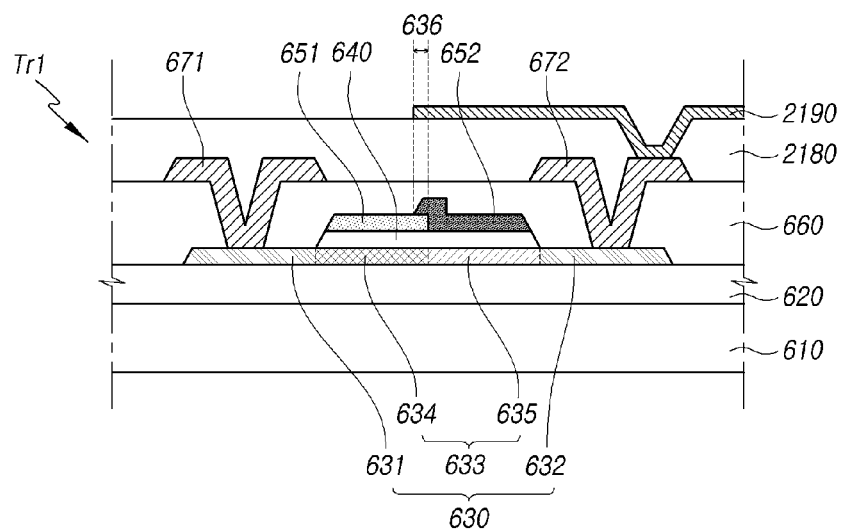
FIG. 21 is a cross-sectional view illustrating a transistor having a structure connected to a pixel electrode when the first TFT according to the embodiments of the present disclosure is disposed in a subpixel of the panel.

FIG. 21 is a cross-sectional view illustrating a transistor having a structure in which a first TFT is connected to a pixel electrode when the first TFT according to the embodiments of the present disclosure is disposed in a subpixel of the panel.

In the following description, details (configuration, effects, etc.) which are the same as those of the above-described embodiments may be omitted.

Referring to FIG. 21, among the first TFTs Tr1 disposed in subpixels SP in the active area A/A, a transistor in which the second electrode 672 of the first TFT Tr1 is to be electrically connected to a pixel electrode 2190 may exist.

A planarization layer 2180 may be disposed on the first electrode 671, the second electrode 672, and the interlayer insulating film 660 of the first TFT Tr1.

The pixel electrode 2190 may be disposed on the planarization layer 2180. The pixel electrode 2190 may be electrically connected to the second electrode 672 of the first TFT Tr1 through a contact hole provided in the planarization layer 2180.

The second electrode 672 may be a source electrode or a drain electrode of the first TFT Tr1.

Although a configuration in which the first TFT Tr1 of the present disclosure is disposed in the active area A/A is illustrated in FIG. 21, the first TFT Tr1 according to the embodiments of the present disclosure may also be disposed in the non-active area N/A which is an outer area of the panel (when the electronic device is a display device).

Also, FIG. 21 shows a structure in which the first TFT Tr1 having the structure of FIG. 6A is electrically connected to the pixel electrode 2190, but the present disclosure is not limited thereto. At least one of the first TFTs Tr1 having structures according to embodiments of the present disclosure including FIGS. 11 and 12 may be electrically connected to the pixel electrode 2190.

The structure of the first TFT according to embodiments of the present disclosure is not limited thereto.

Figure 22:
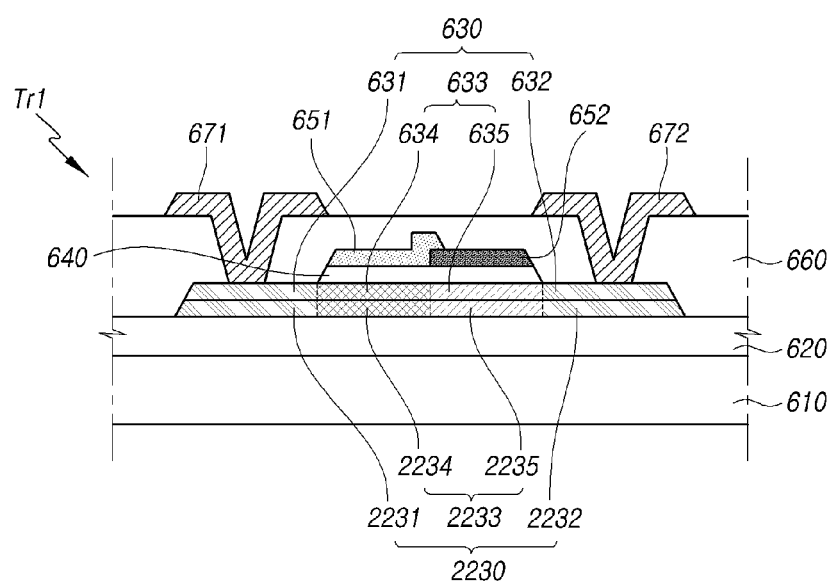
FIG. 22 is a cross-sectional view illustrating a structure disposed in an electronic device according to still other embodiments of the present disclosure.

FIG. 22 is a cross-sectional view illustrating a structure disposed in an electronic device according to still other embodiments of the present disclosure.

In the following description, details (configuration, effects, etc.) which are the same as those of the above-described embodiments may be omitted.

Referring to FIG. 22, a second active layer 2230 may be disposed under a first active layer 630 of a first TFT Tr1 of the present disclosure.

A channel area 2233 of the second active layer 2230 may be provided in an area corresponding to a channel area 633 of the first active layer 630.

The channel area 2233 of the second active layer 2230 may be provided between a third area 2231 and a fourth area 2232 of the second active layer 2230. The channel area 2233 of the second active layer 2230 may include a third channel area 2234 and a fourth channel area 2235 which is integrated with the third channel area 2234.

The third area 2231 and the fourth area 2232 of the second active layer 2230 may be conductive areas.

The channel area 2233 of the second active layer 2230 may have a lower mobility than the channel area 633 of the first active layer 630. Since the mobility of the channel area 2233 of the second active layer 2230 is lower than the mobility of the channel area 633 of the first active layer 630, the Vth of the first TFT Tr1 may be moved to a positive value.

Meanwhile, FIG. 22 shows a structure in which the second active layer 2230 is disposed under the first active layer 630, but the present disclosure is not limited thereto. The second active layer 2230 may be disposed on the first active layer 630.

As described above, the electronic device according to the embodiments of the present disclosure may include the first TFTs Tr1 having at least one structure among the structures of FIGS. 6A, 11, 12,21, and 22 and may also include transistors having a different structure.

Figure 23:
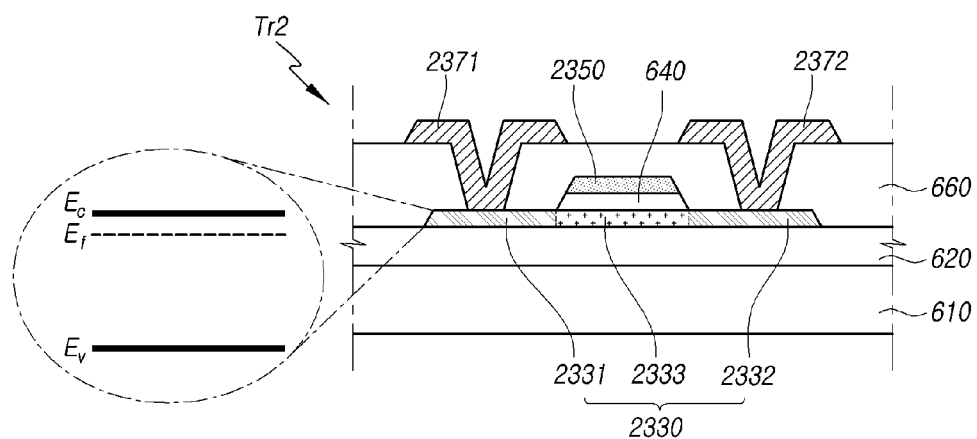
FIG. 23 is a cross-sectional view illustrating a TFT structure according to yet other embodiments of the present disclosure.

FIG. 23 is a cross-sectional view illustrating a TFT structure according to yet other embodiments of the present disclosure.

In the following description, details (configuration, effects, etc.) which are the same as those of the above-described embodiments may be omitted.

Referring to FIG. 23, the electronic device according to the embodiments of the present disclosure may include the first TFTs Tr1 having at least one structure among the above-described structures of FIGS. 6A, 11, 12,21, and 22 and may additionally include a second TFT Tr2 shown in FIG. 23.

The second TFT Tr2 may include a third active layer 2330, a third gate electrode 2350, a third electrode 2371, and a fourth electrode 2372.

Specifically, at least one buffer layer 620 may be disposed on a substrate 610, and the third active layer 2330 may be disposed on the buffer layer 620.

The third active layer 2330 may be an oxide semiconductor.

The third active layer 2330 may include a fifth area 2331, a sixth area 2332 spaced apart from the fifth area 2331, and a channel area 2333 of the third active layer 2330 provided between the fifth area 2331 and the sixth area 2332.

A gate insulating film 640 may be disposed on the third active layer 2330.

The gate insulating film 640 may be disposed to expose a part of the third active layer 2330.

For example, the gate insulating film 640 may be disposed to expose the fifth area 2331 and the sixth area 2332 of the third active layer 2330. The fifth area 2331 and the sixth area 2332 of the third active layer 2330 may be conductive areas.

The third gate electrode 2350 may be disposed on the gate insulating film 640. Although not shown in FIG. 23, the third gate electrode 2350 may be disposed on the same layer as the above-described first and second gate electrodes of the first TFTs Tr1.

The third gate electrode 2350 may include any one among aluminum (Al), copper (Cu), molybdenum (Mo), titanium (Ti), silicon (Si), silver (Ag), gold (Au), and alloys thereof, but the present disclosure is not limited thereto.

The third gate electrode 2350 may overlap the channel area 2333 of the third active layer 2330.

An interlayer insulating film 660 may be disposed on the third gate electrode 2350.

The third electrode 2371 and the fourth electrode 2372 of the second TFT Tr2 may be disposed apart from each other on the interlayer insulating film 660. The third electrode 2371 and the fourth electrode 2372 may be disposed on the same layer as the above-described first and second electrodes of the first TFTs Tr1, but the present disclosure is not limited thereto.

The third electrode 2371 may be connected to the filth area 2331 of the third active layer 2330 through a contact hole provided in the interlayer insulating film 660, and the fourth electrode 2372 may be connected to the sixth area 2332 of the third active layer 2330 through another contact hole provided in the interlayer insulating film 660.

The second TFT Tr2 may have the single channel area 2333 because the single third gate electrode 2350 is disposed on the third active layer 2330.

Specifically, since the single channel area 2333 overlaps the single third gate electrode 2350 having a specific hydrogen diffusion barrier, a hydrogen content in the single channel area 2333 of the third active layer 2330 may be uniform regardless of areas.

For this reason, as shown in FIG. 23, a Fermi level in the channel area 2333 of the third active layer 2330 may be uniform.

Meanwhile, the second TFT Tr2 may be a TFT, for example, at least one of the first and second transistors of FIGS. 3 and 4 and the pull-up transistor and pull-down transistor of FIG. 5 other than a driving transistor.

When the second TFT Tr2 is a TFT other than a driving transistor, high operation speed is required, and thus the hydrogen diffusion barrier of the third gate electrode 2350 may be low. Accordingly, the hydrogen content in the channel area 2333 of the third active layer 2330 may be high.

Therefore, as shown in FIG. 23, the Fermi level of the second TFT Tr2 is adjacent to the conduction band so that the second TFT Tr2 may have high mobility and a low S parameter.

Also, the first TFT Tr1 having at least one structure among the structures of FIGS. 6A, 11, 12,21, and 22 may be a driving transistor disposed in the electronic device, but the present disclosure is not limited thereto.

According to embodiments of the present disclosure, it is possible to provide a TFT array substrate having a structure in which two different gate electrodes are disposed on the same layer on one active layer to simultaneously control the threshold voltage, mobility, and S parameter of a TFT and an electronic device including the TFT array substrate.

According to embodiments of the present disclosure, it is possible to provide a TFT array substrate which has a driving transistor structure with a positive threshold voltage value and a high S parameter and an electronic device including the TFT array substrate.

According to embodiments of the present disclosure, it is possible to provide a TFT array substrate which has a TFT structure with high mobility and an electronic device including the TFT array substrate.

According to embodiments of the present disclosure, it is possible to simultaneously provide a driving transistor having a positive Vth value and a high S parameter and a TFT (a transistor other than a driving transistor) having a TFT structure with high mobility in one panel.

The above description has been presented to enable any person skilled in the art to make and use the technical idea of the present disclosure, and has been provided in the context of a particular application and its requirements. Various modifications, additions, and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An electronic device comprising:
a panel including at least one first thin film transistor; and
a driving circuit configured to drive the panel,
wherein the panel comprises:
a substrate;
a first active layer disposed on the substrate, including a first area, a second area spaced apart from the first area, and a channel area provided between the first area and the second area, and formed of an oxide semiconductor;
a gate insulating film disposed on the first active layer;
a first gate electrode disposed on the gate insulating film;
a second gate electrode disposed on the same layer as the first gate electrode to overlap one end of the first gate electrode and to which a signal corresponding to a signal applied to the first gate electrode is applied;
an interlayer insulating film disposed on the substrate on which the first gate electrode and the second gate electrode are disposed; and
a first electrode and a second electrode disposed apart from each other on the interlayer insulating film.

2. The electronic device of claim 1, wherein the first gate electrode and the second gate electrode include materials having different hydrogen formation energies and different hydrogen diffusion barriers.

3. The electronic device of claim 2, wherein each of the first gate electrode and the second gate electrode includes any one of aluminum (Al), copper (Cu), molybdenum (Mo), titanium (Ti), silicon (Si), silver (Ag), gold (Au), and alloys thereof, and
the first gate electrode and the second gate electrode include different materials.

4. The electronic device of claim 1, wherein the channel area of the first active layer includes a first channel area and a second channel area integrated with the first channel area,
the first channel area overlaps the first gate electrode,
the second channel area overlaps the second gate electrode, and
an area of the channel area overlapping the first gate electrode and the second gate electrode is included in the first channel area or the second channel area overlapping one of the first gate electrode and the second gate electrode having a high hydrogen diffusion barrier.

5. The electronic device of claim 4, wherein a Fermi level of the first channel area differs from a Fermi level of the second channel area, and
an energy band bends at a boundary between the first channel area and the second channel area.

6. The electronic device of claim 4, wherein a hydrogen content of the first channel area differs from a hydrogen content of the second channel area.

7. The electronic device of claim 4, wherein a length of the first gate electrode differs from a length of the second gate electrode, and
a length of the first channel area differs from a length of the second channel area.

8. The electronic device of claim 1, wherein a thickness of the gate insulating film overlapping the first gate electrode corresponds to a thickness of the gate insulating film overlapping the second gate electrode.

9. The electronic device of claim 1, wherein a plurality of first thin film transistors identical to the at least one first thin film transistor are disposed in the panel, and
identical data voltages are applied to the first gate electrode and the second gate electrode of the at least one first thin film transistor.

10. The electronic device of claim 9, wherein a hydrogen diffusion barrier of the first gate electrode is lower than a hydrogen diffusion barrier of the second gate electrode.

11. The electronic device of claim 10, wherein when carriers of the first thin film transistors are moved from a first channel area toward a second channel area in the first active layer, a Fermi level of the first channel area overlapping the first gate electrode is higher than a Fermi level of the second channel area overlapping the second gate electrode.

12. The electronic device of claim 10, wherein a length of the first gate electrode is greater than a length of the second gate electrode.

13. The electronic device of claim 1, wherein a plurality of driving transistors and a plurality of first thin film transistors identical to the at least one first thin film transistor are disposed in the panel, and the at least one first thin film transistor is a thin film transistor transferring a signal to the driving transistors or a thin film transistor disposed in a non-active area which is an outer area of an active area of the panel.

14. The electronic device of claim 13, wherein a hydrogen diffusion barrier of the first gate electrode is higher than a hydrogen diffusion barrier of the second gate electrode.

15. The electronic device of claim 13, wherein when carriers of the first thin film transistors are moved from a first channel area toward a second channel area in the first active layer, a Fermi level of the first channel area is lower than a Fermi level of the second channel area.

16. The electronic device of claim 15, wherein a length of the first gate electrode is smaller than a length of the second gate electrode.

17. The electronic device of claim 1, further comprising a second active layer disposed on or under the first active layer, wherein mobility in a channel area of the second active layer is lower than mobility in the channel area of the first active layer.

18. The electronic device of claim 1, further comprising at least one second thin film transistor disposed on the panel, wherein the second thin film transistor comprises:
a third active layer disposed on the substrate;
a third gate electrode disposed on the third active layer and disposed on the same layer as the first gate electrode and the second gate electrode; and
a third electrode and a fourth electrode disposed on the third gate electrode to be spaced apart from each other on the same layer as the first electrode and the second electrode and connected to the third active layer.

19. The electronic device of claim 18, wherein the second thin film transistor is a thin film transistor transferring a signal to a driving transistor disposed in the panel or a thin film transistor disposed in a non-active area which is an outer area of an active area of the panel.

20. A thin film transistor array substrate comprising:
a substrate;
a first active layer disposed on the substrate, including a first area, a second area spaced apart from the first area, and a channel area provided between the first area and the second area, and formed of an oxide semiconductor;
a gate insulating film disposed on the first active layer;
a first gate electrode disposed on the gate insulating film;
a second gate electrode disposed on the same layer as the first gate electrode to overlap one end of the first gate electrode and to which a signal corresponding to a signal applied to the first gate electrode is applied;
an interlayer insulating film disposed on the substrate on which the first gate electrode and the second gate electrode are disposed; and
a first electrode and a second electrode disposed on the interlayer insulating film to be spaced apart from each other.

* * * * *